US012696653B2

(12) United States Patent
Asaoka et al.

(10) Patent No.: US 12,696,653 B2
(45) Date of Patent: Jul. 28, 2026

(54) DISPLAY DEVICE AND DISPLAY DEVICE MANUFACTURING METHOD

(71) Applicant: Sharp Display Technology Corporation, Kameyama City (JP)

(72) Inventors: Yasushi Asaoka, Kameyama City (JP); Sentaro Kida, Kameyama City (JP); Takahiro Adachi, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 450 days.

(21) Appl. No.: 18/561,076

(22) PCT Filed: Jun. 30, 2021

(86) PCT No.: PCT/JP2021/024871
§ 371 (c)(1),
(2) Date: Nov. 15, 2023

(87) PCT Pub. No.: WO2023/276085
PCT Pub. Date: Jan. 5, 2023

(65) Prior Publication Data
US 2024/0260386 A1 Aug. 1, 2024

(51) Int. Cl.
*H10K 59/00* (2023.01)
*H10K 50/115* (2023.01)
*H10K 59/12* (2023.01)

(52) U.S. Cl.
CPC ....... *H10K 59/771* (2023.02); *H10K 59/1201* (2023.02); *H10K 50/115* (2023.02)

(58) Field of Classification Search
CPC ......... H10K 50/14–167; H10K 59/771; H10K 59/1201; H10K 59/115
See application file for complete search history.

(56) References Cited

U.S. PATENT DOCUMENTS

| | | | |
|---|---|---|---|
| 2014/0084257 A1 | 3/2014 | Kim et al. | |
| 2016/0118631 A1 | 4/2016 | Kim et al. | |
| 2019/0280062 A1* | 9/2019 | Ma | H10K 59/122 |
| 2020/0235178 A1* | 7/2020 | Shin | H10K 59/122 |
| 2024/0057394 A1* | 2/2024 | Sakuma | H10K 59/122 |
| 2025/0204159 A1* | 6/2025 | Lim | H10K 59/122 |

FOREIGN PATENT DOCUMENTS

| | | |
|---|---|---|
| JP | 2014-063719 A | 4/2014 |

* cited by examiner

*Primary Examiner* — Mariceli Santiago
(74) *Attorney, Agent, or Firm* — ScienBiziP, P.C.

(57) ABSTRACT

A display device includes a substrate, on the substrate, a light-emitting element including a first electrode, a second electrode, and a light-emitting layer and a charge transfer layer between the first electrode and the second electrode, in which the display device includes a light-emitting region of the light-emitting element and a non-light-emitting region that is a peripheral portion of the light-emitting region, a protruding portion is provided in a layer lower than the charge transfer layer in part of the non-light-emitting region, and the charge transfer layer is formed as a continuous film in a display region including the light-emitting region and the non-light-emitting region on the substrate, and includes a thin film portion, on the protruding portion, being thinner than a portion in the light-emitting region and a portion in the non-light-emitting region other than the protruding portion.

20 Claims, 13 Drawing Sheets (a)

DISPLAY DEVICE AND DISPLAY DEVICE MANUFACTURING METHOD

TECHNICAL FIELD

The disclosure relates to a display device and a method for manufacturing the display device.

BACKGROUND ART

In recent years, various display devices provided with light-emitting elements have been developed. In particular, a display device provided with a quantum dot light emitting diode (QLED) or an organic light emitting diode (OLED) has attracted a great deal of attention because of its ability to achieve low power consumption, thinness, and high image quality.

PTL 1 describes, in an organic light-emitting display panel, a configuration in which a first common layer, which is a charge transfer layer having a portion thicker in a non-light-emitting region than in a light-emitting region, is provided as a common layer over an entire display region, and a configuration in which a second common layer, which is a charge transfer layer having a uniform film thickness, is provided as a common layer over an entire display region.

CITATION LIST

Patent Literature

PTL 1: JP 2014-63719 A

SUMMARY

Technical Problem

However, as described in PTL 1, in the case of the configuration in which the first common layer, which is the charge transfer layer having the portion thicker in the non-light-emitting region than in the light-emitting region, is provided, or the configuration in which the second common layer, which is the charge transfer layer having the uniform film thickness, is provided, shrinkage of the charge transfer layer during a step of forming the charge transfer layer, which is one continuous film, results in inherent stress in the charge transfer layer, which may cause uncontrolled cracks based on unintended triggers, that is, cracks in undesirable locations. In particular, since the film thickness of the first common layer in the light-emitting region is thinner than the film thickness of part of the non-light-emitting region, cracks are likely to occur in the light-emitting region, and since the second common layer is formed with the uniform film thickness in the light-emitting region and the non-light-emitting region, cracks are inevitable in the light-emitting region. Thus, cracks in the light-emitting region of the light-emitting element may cause deterioration in display quality.

An aspect of the disclosure has been made in light of the problems described above, and an objective of the aspect is to provide a display device and a method of manufacturing the display device that can suppress cracks in a charge transfer layer in a light-emitting region of a light-emitting element, thereby suppressing deterioration in display quality.

Solution to Problem

In order to solve the above problems, a display device according to the disclosure includes a substrate, and on the substrate, a light-emitting element including a first electrode, a second electrode, and a light-emitting layer and a charge transfer layer between the first electrode and the second electrode, in which the display device includes a light-emitting region of the light-emitting element and a non-light-emitting region being a peripheral portion of the light-emitting region, a protruding portion is provided in a layer lower than the charge transfer layer in part of the non-light-emitting region, and the charge transfer layer is formed as a continuous film in a display region including the light-emitting region and the non-light-emitting region on the substrate, and includes a thin film portion, on the protruding portion, being thinner than a portion in the light-emitting region and a portion in the non-light-emitting region other than the protruding portion.

In order to solve the above problems, a method of manufacturing a display device according to the disclosure includes forming multiple first electrodes on a substrate, forming light-emitting layers including forming a first light-emitting layer on some of the multiple first electrodes, forming a second light-emitting layer on some other of the multiple first electrodes, and forming a third light-emitting layer on remains of the multiple first electrodes, providing a protruding portion in a region between the multiple first electrodes, after the providing a protruding portion, forming, on the protruding portion, a charge transfer layer including a thin film portion having a film thickness thinner than portions on the multiple first electrodes and a portion other than on the protruding portion in the region between the multiple first electrodes as a continuous film in a display region including the multiple first electrodes and the region between the multiple first electrodes on the substrate, and forming a second electrode.

Advantageous Effects of Disclosure

An aspect of the disclosure can provide a display device and a method of manufacturing the display device that can suppress cracks in a charge transfer layer in a light-emitting region of a light-emitting element, thereby suppressing deterioration in display quality.

BRIEF DESCRIPTION OF DRAWINGS

In FIG. 10, (a), (b), (c), (d), and (e) are diagrams illustrating an example of another manufacturing process of the display device according to the first embodiment.

DESCRIPTION OF EMBODIMENTS

Embodiments of the disclosure will be described below with reference to FIG. 1 to FIG. 17. Hereinafter, for convenience of description, configurations having the same functions as those described in a specific embodiment are denoted by the same reference signs, and descriptions thereof will be omitted.

First Embodiment

Figure 1:
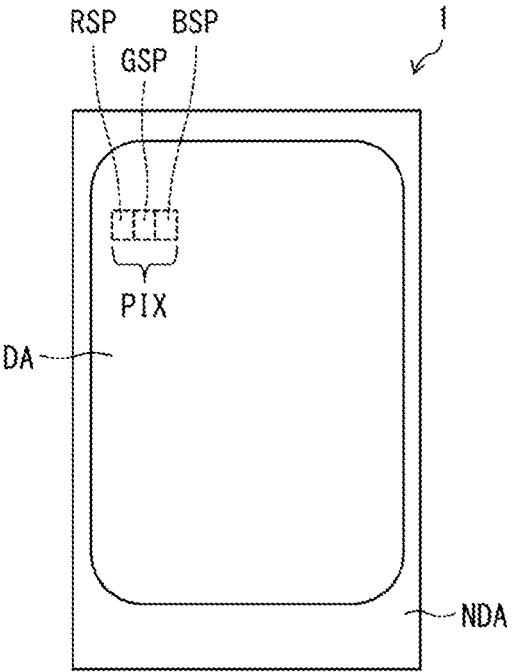
FIG. 1 is a plan view illustrating a schematic configuration of a display device according to a first embodiment.

FIG. 1 is a plan view illustrating a schematic configuration of a display device 1 according to the first embodiment.

As illustrated in FIG. 1, the display device 1 includes a frame region NDA and a display region DA. Multiple pixels PIX are provided in the display region DA of the display device 1, and each pixel PIX includes a red subpixel RSP, a green subpixel GSP, and a blue subpixel BSP.

In the present embodiment, a case will be described as an example in which one pixel PIX includes the red subpixel RSP, the green subpixel GSP, and the blue subpixel BSP, but no such limitation is intended. For example, one pixel PIX may further include a subpixel of another color in addition to the red subpixel RSP, the green subpixel GSP, and the blue subpixel BSP.

Figure 2:
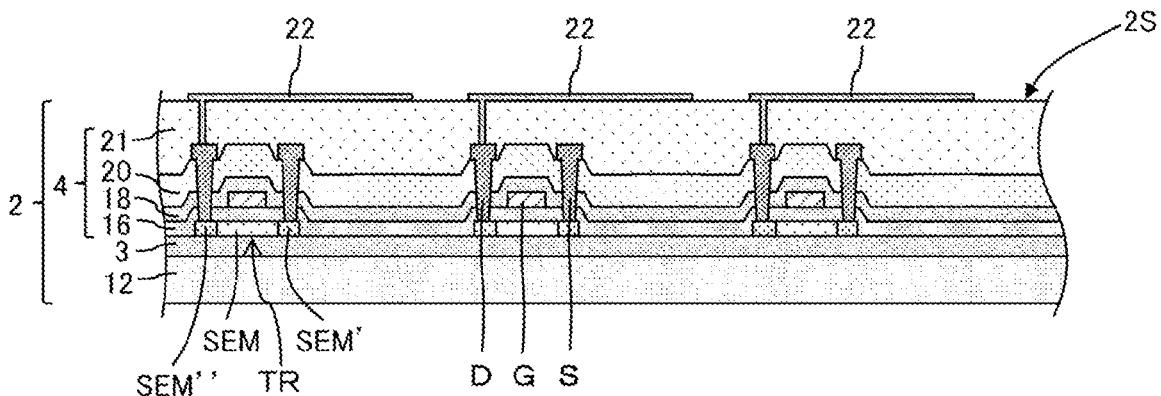
FIG. 2 is a cross-sectional view illustrating a schematic configuration of a substrate including transistors, which is provided in the display device according to the first embodiment.

FIG. 2 is a cross-sectional view illustrating a schematic configuration of a substrate 2 including transistors TR, which is provided in the display device 1 according to the first embodiment.

As illustrated in FIG. 2, in the substrate (substrate) 2 including the transistors TR, which is provided in the display device 1, a barrier layer 3 and a thin film transistor layer 4 including the transistors TR are provided on a support substrate 12 in this order from a support substrate 12 side. First electrodes 22 are provided on an upper face of the substrate 2 including the transistors TR, that is, on a face 2S on a light-emitting element side.

The support substrate 12 may be, for example, a resin substrate made of a resin material such as polyimide, or may be a glass substrate. In the present embodiment, the display device 1 is a flexible display device, and thus a case will be described as an example in which the resin substrate made of the resin material such as polyimide is used as the support substrate 12. However, no such limitation is intended. In a case where the display device 1 is a non-flexible display device, the glass substrate may be used as the support substrate 12.

The barrier layer 3 is a layer that inhibits foreign matters, such as water and oxygen, from penetrating through to the transistors TR and color light-emitting elements described below. For example, the barrier layer 3 can be formed of a silicon oxide film, a silicon nitride film, or a silicon oxynitride film, or a layered film thereof formed by chemical vapor deposition (CVD).

A transistor TR portion of the thin film transistor layer 4 including the transistors TR includes a semiconductor film SEM, doped semiconductor films SEM' and SEM", an inorganic insulating film 16, a gate electrode G, an inorganic insulating film 18, an inorganic insulating film 20, a source electrode S, a drain electrode D, and a flattening film 21. A portion other than the transistor TR portion of the thin film transistor layer 4 including the transistors TR includes the inorganic insulating film 16, the inorganic insulating film 18, the inorganic insulating film 20, and the flattening film 21.

The semiconductor films SEM, SEM' and SEM" may be formed of low-temperature polysilicon (LTPS) or an oxide semiconductor (for example, an In—Ga—Zn—O based semiconductor), for example. In the example of the present embodiment described herein, the transistor TR has a top gate structure. However, no such limitation is intended, and the transistor TR may have a bottom gate structure.

The gate electrode G, the source electrode S, and the drain electrode D may be formed of a single-layer film or a layered film of a metal including, for example, at least one of aluminum, tungsten, molybdenum, tantalum, chromium, titanium, and copper.

The inorganic insulating film 16, the inorganic insulating film 18, and the inorganic insulating film 20 may be formed of a silicon oxide film, a silicon nitride film, a silicon-oxide-nitride film, or a layered film of these, formed using chemical vapor deposition (CVD).

The flattening film 21 may be formed of coatable organic materials such as polyimide and acrylic.

As illustrated in FIG. 2, a control circuit including the transistors TR for controlling the multiple first electrodes 22, respectively is provided in the thin film transistor layer 4 including the transistors TR.

Figure 3:
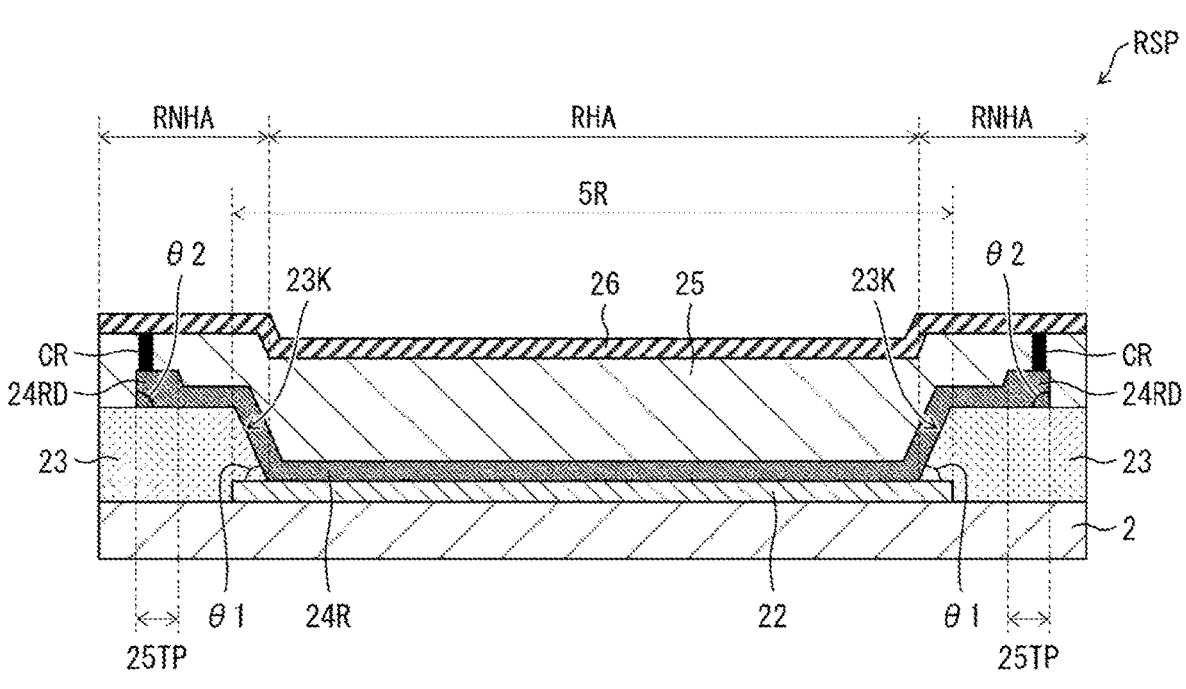
FIG. 3 is a cross-sectional view illustrating a schematic configuration of a red subpixel provided in the display device according to the first embodiment.
Figure 4:
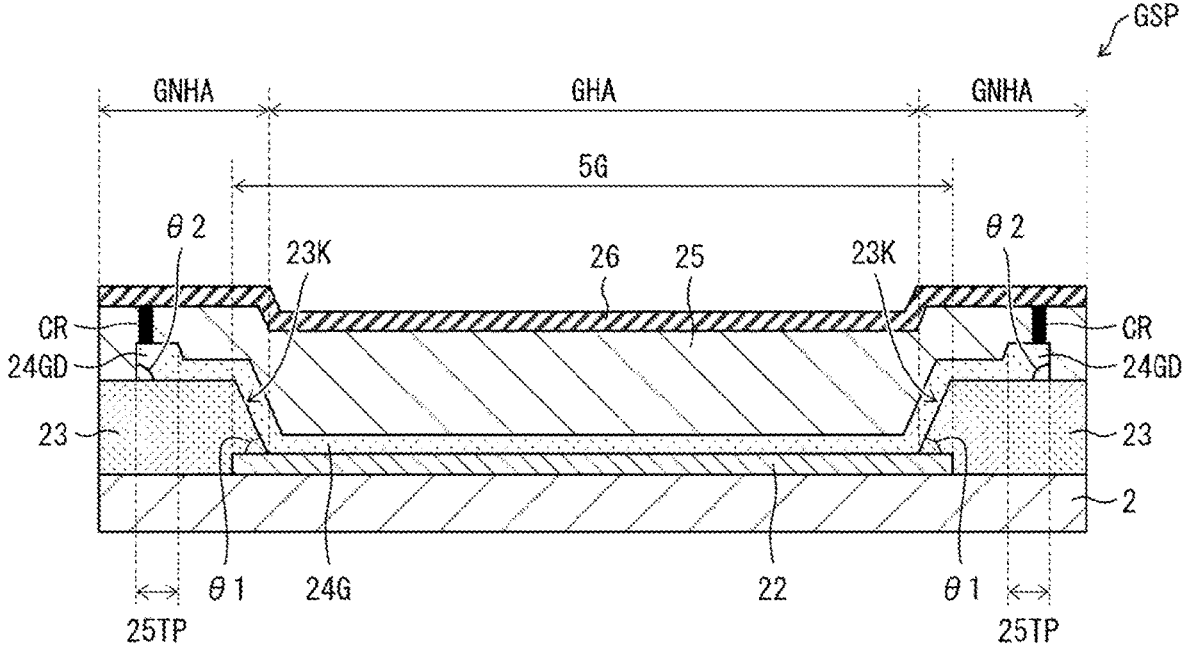
FIG. 4 is a cross-sectional view illustrating a schematic configuration of a green subpixel provided in the display device according to the first embodiment.
Figure 5:
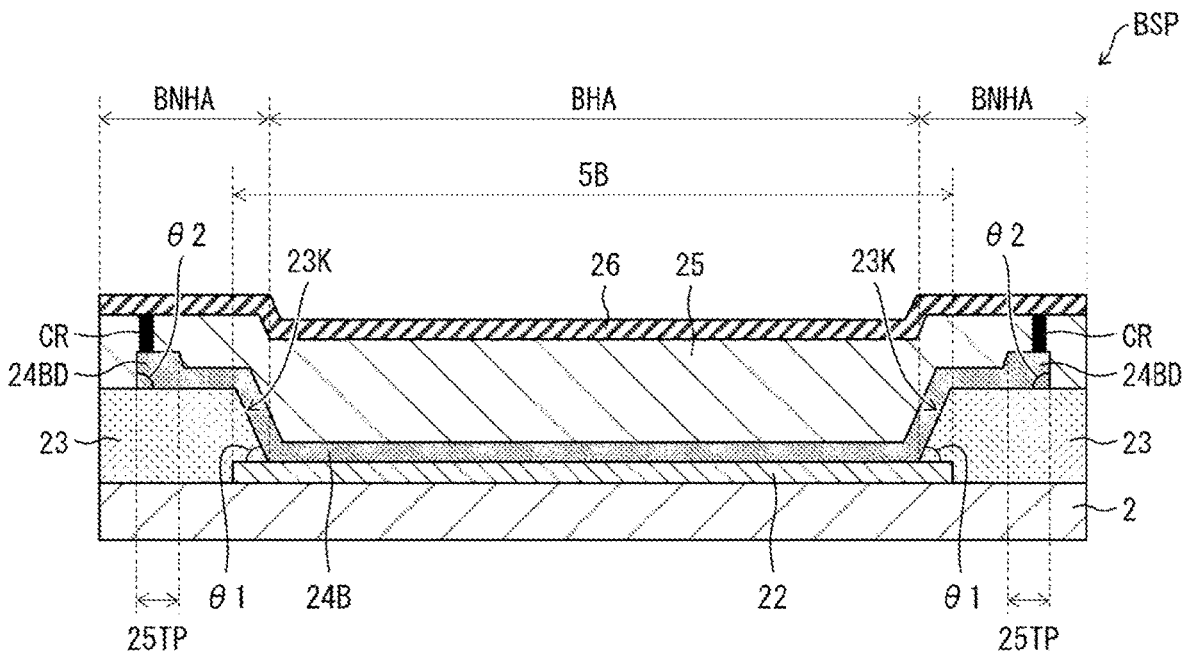
FIG. 5 is a cross-sectional view illustrating a schematic configuration of a blue subpixel provided in the display device according to the first embodiment.

FIG. 3 is a cross-sectional view illustrating a schematic configuration of a red subpixel RSP provided in the display device 1 according to the first embodiment. FIG. 4 is a cross-sectional view illustrating a schematic configuration of a green subpixel GSP provided in the display device 1 according to the first embodiment. FIG. 5 is a cross-sectional view illustrating a schematic configuration of a blue subpixel BSP provided in the display device 1 according to the first embodiment.

As illustrated in FIG. 3, the red subpixel RSP of the display device 1 includes the substrate 2 including the transistors TR, on the substrate 2 including the transistors TR, the first electrode 22, a second electrode 26, and a red light-emitting element (first light-emitting element) 5R including a light-emitting layer (red light-emitting layer) 24R and a charge transfer layer 25 between the first electrode 22 and the second electrode 26. The red subpixel RSP of the display device 1 has a light-emitting region RHA of the red light-emitting element 5R and a non-light-emitting region RNHA that is a peripheral portion of the light-emitting region RHA, and a protruding portion 24RD is provided in a layer lower than the charge transfer layer 25 in part of the non-light-emitting region RNHA. The charge transfer layer 25 is formed as a continuous film in the display region DA including the light-emitting region RHA and the non-light-emitting region RNHA on the substrate 2 including the transistors TR, and includes a thin film portion 25TP on the protruding portion 24RD that is thinner than a portion in the light-emitting region RHA and a portion in the non-light-emitting region RNHA other than the protruding portion 24RD.

In the red subpixel RSP of the display device 1 including the charge transfer layer 25 including the thin film portion 25TP in part of the non-light-emitting region RNHA, shrinkage of the charge transfer layer 25, which is one continuous film, during a step of forming the charge transfer layer 25 causes stress to be inherent in the charge transfer layer 25 and cracks CR may occur based on unintended triggers. However, positions where the cracks CR occur can be limited to the thin film portion 25TP of the charge transfer layer 25.

As illustrated in FIG. 4, the green subpixel GSP of the display device 1 includes the substrate 2 including the transistors TR, on the substrate 2 including the transistors TR, the first electrode 22, the second electrode 26, and a green light-emitting element (second light-emitting element) 5G including a light-emitting layer (green light-emitting layer) 24G and the charge transfer layer 25 between the first electrode 22 and the second electrode 26. The green subpixel GSP of the display device 1 has a light-emitting region GHA of the green light-emitting element 5G and a non-light-emitting region GNHA that is a peripheral portion of the light-emitting region GHA, and a protruding portion 24GD is provided in a layer lower than the charge transfer layer 25 in part of the non-light-emitting region GNHA. The charge transfer layer 25 is formed as a continuous film in the display region DA including the light-emitting region GHA and the non-light-emitting region GNHA on the substrate 2 including the transistors TR, and includes a thin film portion 25TP on the protruding portion 24GD that is thinner than a portion in the light-emitting region GHA and a portion in the non-light-emitting region GNHA other than the protruding portion 24GD.

In the green subpixel GSP of the display device 1 including the charge transfer layer 25 including the thin film portion 25TP in part of the non-light-emitting region GNHA, shrinkage of the charge transfer layer 25, which is one continuous film, during the step of forming the charge transfer layer 25 causes stress to be inherent in the charge transfer layer 25 and the cracks CR may occur based on unintended triggers. However, positions where the cracks CR occur can be limited to the thin film portion 25TP of the charge transfer layer 25.

As illustrated in FIG. 5, the blue subpixel BSP of the display device 1 includes the substrate 2 including the transistors TR, on the substrate 2 including the transistors TR, the first electrode 22, the second electrode 26, and a blue light-emitting element (third light-emitting element) 5B including a light-emitting layer (blue light-emitting layer) 24B and the charge transfer layer 25 between the first electrode 22 and the second electrode 26. The blue subpixel BSP of the display device 1 has a light-emitting region BHA of the blue light-emitting element 5B and a non-light-emitting region BNHA that is a peripheral portion of the light-emitting region BHA, and a protruding portion 24BD is provided in a layer lower than the charge transfer layer 25 in part of the non-light-emitting region BNHA. The charge transfer layer 25 is formed as a continuous film in the display region DA including the light-emitting region BHA and the non-light-emitting region BNHA on the substrate 2 including the transistors TR, and includes a thin film portion 25TP on the protruding portion 24BD that is thinner than a portion in the light-emitting region BHA and a portion in the non-light-emitting region BNHA other than the protruding portion 24BD.

In the blue subpixel BSP of the display device 1 including the charge transfer layer 25 including the thin film portion 25TP in part of the non-light-emitting region BNHA, shrinkage of the charge transfer layer 25, which is one continuous film, during the step of forming the charge transfer layer 25 causes stress to be inherent in the charge transfer layer 25 and the cracks CR may occur based on unintended triggers. However, positions where the cracks CR occur can be limited to the thin film portion 25TP of the charge transfer layer 25.

As described above, in the display device 1, cracks CR in the charge transfer layer 25 in the light-emitting region of the light-emitting element can be suppressed, thereby suppressing deterioration in display quality.

The light-emitting region of the light-emitting element means a region in which a function layer including the light-emitting layer and the charge transfer layer 25 is disposed between the first electrode 22 and the second electrode 26, and the function layer is in direct contact with both the first electrode 22 and the second electrode 26. On the other hand, the non-light-emitting region of the light-emitting element means a region in which the function layer is not in direct contact with at least one of the first electrode 22 and the second electrode 26.

In the present embodiment, as illustrated in FIG. 3, FIG. 4, and FIG. 5, a case in which the display device 1 includes an edge cover layer 23 that covers edges of the first electrodes 22, and the protruding portion 24RD, the protruding portion 24GD, and the protruding portion 24BD are provided on the edge cover layer 23 will be described as an example. Thus, in the case of the display device 1 in which the protruding portion 24RD, the protruding portion 24GD, and the protruding portion 24BD are provided on the edge cover layer 23, a thickness of the thin film portion 25TP of the charge transfer layer 25 can be further reduced by a height of the edge cover layer 23, so that the positions where the cracks CR occur can be more reliably limited to the thin film portion 25TP of the charge transfer layer 25.

Without being limited to this configuration, for example, the edge cover layer 23 may be appropriately omitted as long as a protruding portion can be formed below the charge transfer layer 25 and the charge transfer layer 25 including the thin film portion 25TP that is thinner than the portion in the light-emitting region and the portion in the non-light-emitting region other than the portion on the protruding portion can be formed on the protruding portion.

In the present embodiment, as illustrated in FIG. 3, FIG. 4, and FIG. 5, a case in which the display device 1 includes the edge cover layer 23 covering the edges of the first electrodes 22, and an angle θ2 formed by an edge of each of the protruding portions (24RD, 24GD, and 24BD) and a lower face of each of the protruding portions (24RD, 24GD, and 24BD) is larger than an angle θ1 formed by a side surface of the edge cover layer 23 forming an opening 23K that exposes part of the first electrode 22 and a lower face of the edge cover layer 23 provided on the first electrode 22, but the configuration is not limited thereto.

As described above, when the angle θ2 formed by the edge of each of the protruding portions (24RD, 24GD, and 24BD) and the lower face of each of the protruding portion (24RD, 24GD, and 24BD) is larger than the angle θ1 formed by the side surface of the edge cover layer 23 and the lower face of the edge cover layer 23 provided on the first electrode 22, the positions where the cracks CR occur can be more reliably limited to the thin film portion 25TP of the charge transfer layer 25.

In the present embodiment, as illustrated in FIG. 3, FIG. 4, and FIG. 5, an example will be described in which the light-emitting layer 24R is provided below the charge transfer layer 25 and formed in the light-emitting region RHA and the non-light-emitting region RNHA, the protruding portion 24RD is an edge of the light-emitting layer 24R formed in the non-light-emitting region RNHA, the light-emitting layer 24G is provided below the charge transfer layer 25 and formed in the light-emitting region GHA and the non-light-emitting region GNHA, the protruding portion 24GD is an edge of the light-emitting layer 24G formed in the non-light-emitting region GNHA, and the light-emitting layer 24B is provided below the charge transfer layer 25 and formed in the light-emitting region BHA and the non-light-emitting region BNHA, and the protruding portion 24BD is an edge of the light-emitting layer 24B formed in the non-light-emitting region BNHA, but the configuration is not limited thereto. As will be described later, when a template having a predetermined shape is formed using a photosensitive resist and then the light-emitting layer is patterned by a lift-off method using this template, the edge of the light-emitting layer can be easily formed into a protruding shape. As described above, forming the protruding portion using the light-emitting layer necessary for forming the light-emitting element eliminates a need to use another material for forming the protruding portion.

The protruding portion 24RD may be part of the light-emitting layer 24R formed in the non-light-emitting region RNHA instead of the edge of the light-emitting layer 24R formed in the non-light-emitting region RNHA, the protruding portion 24GD may be part of the light-emitting layer 24G formed in the non-light-emitting region GNHA instead of the edge of the light-emitting layer 24G formed in the non-light-emitting region GNHA, and the protruding portion 24BD may be part of the light-emitting layer 24B formed in the non-light-emitting region BNHA instead of the edge of the light-emitting layer 24B formed in the non-light-emitting region BNHA. As will be described later, when a light-emitting layer containing a photosensitive resin is used to pattern the light-emitting layer, a position where the protruding portion is provided in the non-light-emitting region can be selected relatively freely.

Although a height and a width of the protruding portion can be determined as appropriate, considering that the positions where the cracks CR occur are more reliably limited to the thin film portion 25TP of the charge transfer layer 25, the height of the protruding portion is preferably, for example, not less than 40 nm and not more than 1000 nm, a thickness of the thin film portion 25TP is preferably, for example, not less than 1 nm and not more than 100 nm, and the width of the protruding portion (the breadth of the protruding portion (the breadth of the thin film portion 25TP) in FIG. 3, FIG. 4, and FIG. 5) is preferably, for example, not less than 0.08 μm and not more than 2 μm.

Figure 6:
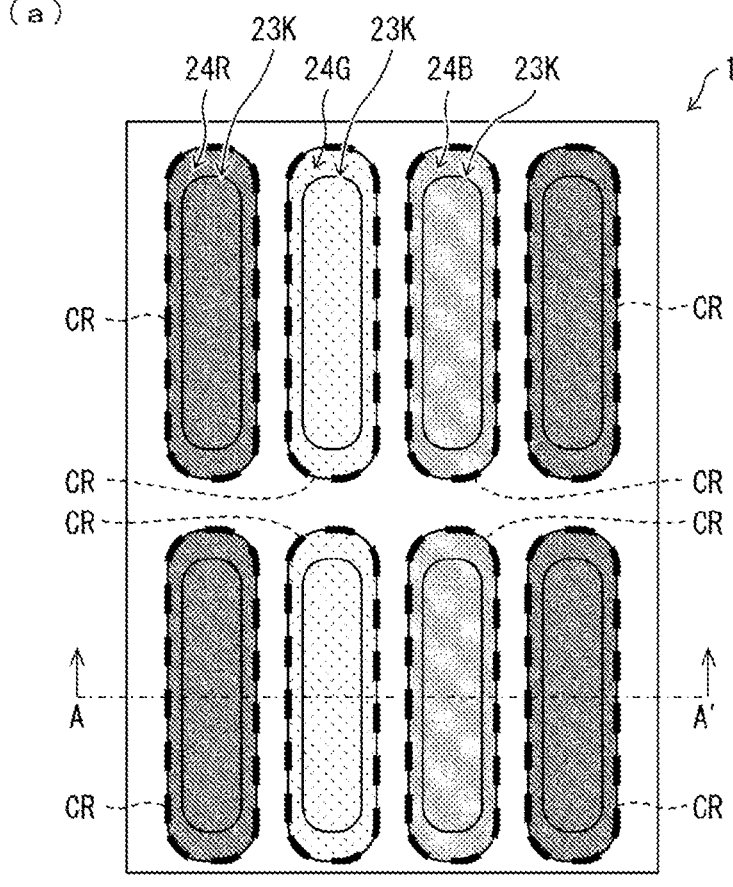
In FIG. 6, (a) is a plan view of the display device according to the first embodiment illustrating positions where cracks occur, and (b) is a cross-sectional view taken along line A-A' illustrated in (a).
Figure 6:
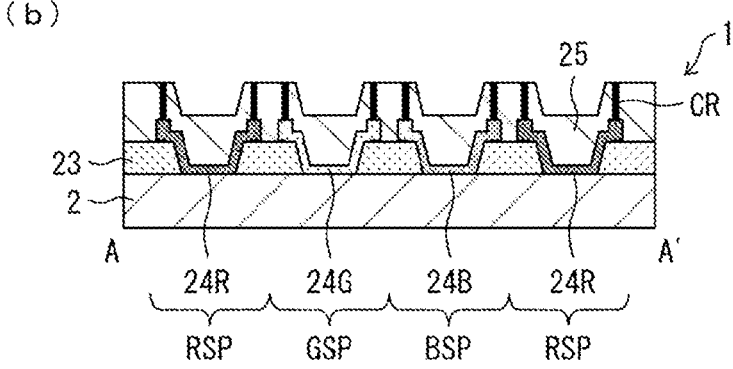

(a) of FIG. 6 is a plan view of the display device 1 according to the first embodiment illustrating the positions where the cracks CR occur, and (b) of FIG. 6 is a cross-sectional view taken along line A-A' illustrated in (a) of FIG. 6.

As illustrated in FIG. 3, FIG. 4, and FIG. 5, in the display device 1 of the present embodiment, the protruding portion 24RD is provided so as to surround the light-emitting region RHA, the protruding portion 24GD is provided so as to surround the light-emitting region GHA, and the protruding portion 24BD is provided so as to surround the light-emitting region BHA, as illustrated in (a) of FIG. 6 and (b) of FIG. 6, the cracks CR are provided so as to surround the light-emitting regions. Therefore, color mixing with adjacent emitted light of another color due to the cracks CR can be suppressed.

In the present embodiment, as will be described later, a template having a predetermined shape is formed using a photosensitive resist, and then a light-emitting layer containing quantum dots (QDs) is patterned by a lift-off method using this template. A case in which the light-emitting layer 24R, the light-emitting layer 24G, and the light-emitting layer 24B all contain quantum dots (QDs) will be described as an example, but the configuration is not limited thereto. For example, as in a fourth embodiment described later, the light-emitting layer may be an organic vapor deposition film when the protruding portion is formed without using the light-emitting layer.

The quantum dots (QDs) may have, for example, a core structure, a core/shell structure, a core/shell/shell structure, or a core/shell with continuously varying ratio structure.

The core may be composed of, for example, Si, C, or the like in a case of a unary system, composed of, for example, CdSe, CdS, CdTe, InP, GaP, InN, ZnSe, ZnS, ZnTe, or the like in a case of a binary system, composed of, for example, CdSeTe, GaInP, ZnSeTe, or the like in a case of a ternary system, and composed of, for example, AIGS or the like in a case of a quaternary system.

The shell can be composed of, for example, CdS, CdTe, CdSe, ZnS, ZnSe, ZnTe, or the like in a case of a binary system, and composed of, for example, CdSSe, CdTeSe, CdSTe, ZnSSe, ZnSTe, ZnTeSe, AlP, or the like in a case of a ternary system.

The charge transfer layer 25 may be, for example, any one of an electron transport layer, a hole transport layer, an electron injection layer, a hole injection layer, an electron injection/transport layer, a hole injection/transport layer, an electron injection/transport and hole blocking layer, a hole injection/transport and electron blocking layer, an electron transport and hole blocking layer, and a hole transport and electron blocking layer.

The charge transfer layer 25 may contain fine particles or may be an inorganic film. When the charge transfer layer 25 contains fine particles, particularly contains inorganic fine particles, or is an inorganic film, shrinkage of the charge transfer layer 25 during a step of forming the charge transfer layer 25, which is one continuous film, can easily cause stress to be inherent in the charge transfer layer 25, thereby making the cracks CR more likely to occur.

When the charge transfer layer 25 is an electron transport layer, an electron transport material constituting the electron transport layer may contain, for example, ZnO, ZnS, ZrO, LiZnO, MgZnO, AlZnO, $TiO_2$, or the like as inorganic fine particles.

When the charge transfer layer 25 is a hole transport layer, a hole transport material constituting the hole transport layer may contain, for example, NiO, MgNiO, MoOx, CuI, CuSCN, $Cu_2O$, CoO, $Cr_2O_3$, $TiO_2$, $CuAlS_2$, or the like as inorganic fine particles. Further, the hole transport material constituting the hole transport layer may be an organic material such as PEDOT:PSS, TFB, p-TPD, PVK, or TAPC. Furthermore, the hole transport material constituting the hole transport layer may be a photosensitive hole transport material, such as OTPD, QUPD, or X-F6-TAPC.

A thickness of the thin film portion 25TP of the charge transfer layer 25 provided in the display device 1 is preferably larger than a width of the crack CR in a direction (horizontal direction) orthogonal to the thickness (vertical direction) of the charge transfer layer 25. In such a case, formation of the second electrode 26, which is a common electrode formed on the entire surface in the display region DA of the display device 1, is easier.

In the present embodiment, the case in which the cracks CR occur in part of the thin film portion 25TP of the charge transfer layer 25 provided in the display device 1 has been described as an example. However, the positions of the cracks CR are not limited thereto, and the cracks CR may be formed in the entire thin film portion 25TP of the charge transfer layer 25. Further, in the charge transfer layer 25 provided in the display device 1, it is not necessary to form the cracks CR in the thin film portion 25TP of the charge transfer layer 25 in advance because the cracks CR need to occur in the thin film portion 25TP only when the cracks CR occur.

The red light-emitting element 5R included in the red subpixel RSP of the display device 1 illustrated in FIG. 3 includes the first electrode 22, the light-emitting layer (red light-emitting layer) 24R, the charge transfer layer 25, and the second electrode 26 in this order from the side of the substrate 2 including the transistors TR. The green light-emitting element 5G included in the green subpixel GSP of the display device 1 illustrated in FIG. 4 includes the first electrode 22, the light-emitting layer (green light-emitting layer) 24G, the charge transfer layer 25, and the second electrode 26 in this order from the side of the substrate 2 including the transistors TR. The blue light-emitting element 5B included in the blue subpixel BSP of the display device 1 illustrated in FIG. 5 includes the first electrode 22, the light-emitting layer (blue light-emitting layer) 24B, the charge transfer layer 25, and the second electrode 26 in this order from the side of the substrate 2 including the transistors TR. The first electrode 22 is an electrode that reflects visible light, and the second electrode 26 is an electrode that transmits visible light.

The red light-emitting element 5R, the green light-emitting element 5G, and the blue light-emitting element 5B may have a normal stack structure in which the first electrode 22 is an anode and the second electrode 26 is a cathode, or may have a reverse stack structure in which the first electrode 22 is a cathode and the second electrode 26 is an anode. In the case of the normal stack structure, the first electrode 22 serving as the anode may be formed of an electrode material that reflects visible light, and the second electrode 26 serving as the cathode may be formed of an electrode material that transmits visible light. In the case of the reverse stack structure, the first electrode 22 serving as the cathode may be formed of an electrode material that reflects visible light, and the second electrode 26 serving as the anode may be formed of an electrode material that transmits visible light.

The electrode material that reflects visible light is not limited as long as the material can reflect visible light and has electrical conductivity. Examples to be used include metal materials such as Al, Mg, Li, and Ag, alloys of the metal materials, layered bodies of the metal materials and transparent metal oxides (e.g., indium tin oxide, indium zinc oxide, indium gallium zinc oxide, etc.), and layered bodies of the alloys and the transparent metal oxides.

On the other hand, the electrode material that transmits visible light is not limited as long as the material can transmit visible light and has electrical conductivity. Examples to be used include thin films made of transparent metal oxide (e.g., indium tin oxide, indium zinc oxide, indium gallium zinc oxide, etc.) and metal materials, such as Al, Mg, Li, and Ag, and electrically conductive nanomaterials such as silver nanowires and carbon nanotubes.

The display device 1 includes the edge cover layer 23 that covers the edges of the first electrodes 22 provided in the red subpixel RSP, the green subpixel GSP, and the blue subpixel BSP, respectively. The edge cover layer 23 can be formed, for example, by applying a photosensitive organic material such as polyimide or acrylic and then patterning the photosensitive organic material by photolithography method.

Although not illustrated, a sealing layer may be further provided on the second electrode of the display device 1. The sealing layer can be formed by layering, for example, an inorganic film, an organic film, and an inorganic film, but the configuration is not limited thereto.

Hereinafter, a method of manufacturing the display device 1 of the present embodiment will be described with reference to FIG. 7 to FIG. 10.

Figure 7:
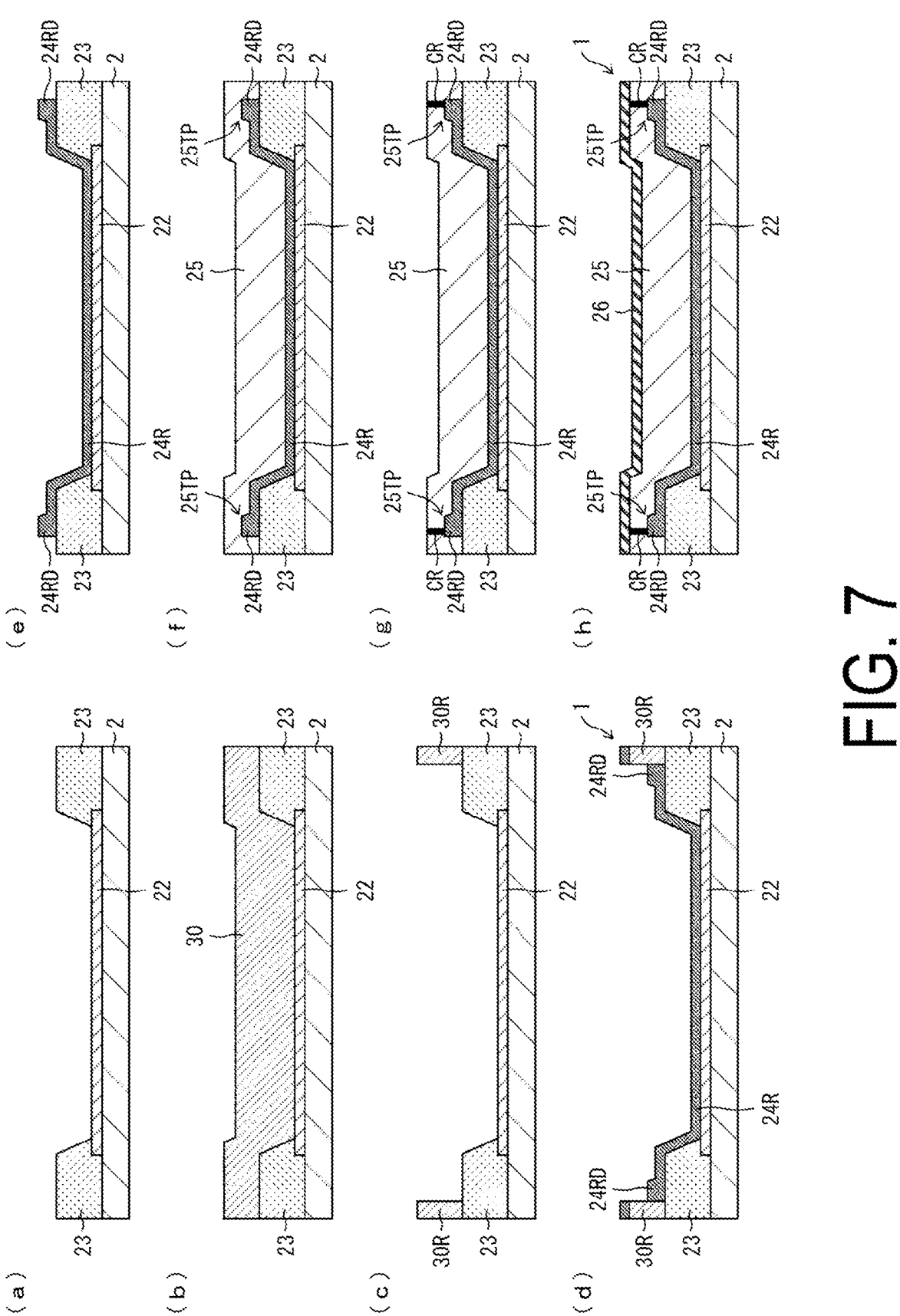
In FIG. 7, (a), (b), (c), (d), (e), (f), (g), and (h) are diagrams illustrating an example of a manufacturing process of the display device according to the first embodiment.

Each of (a) of FIG. 7, (b) of FIG. 7, (c) of FIG. 7, (d) of FIG. 7, (e) of FIG. 7, (f) of FIG. 7, (g) of FIG. 7, and (h) of FIG. 7 is a diagram illustrating an example of a manufacturing process of the display device 1 according to the first embodiment.

With reference to FIG. 7, a description will be given of a case in which a template 30R having a predetermined shape is formed using a photosensitive resist 30, and then the light-emitting layer 24R containing quantum dots (QDs) and not containing a photosensitive resin is patterned by a lift-off method using the template 30R. Although only a case of forming the light-emitting layer 24R is illustrated, the light-emitting layer 24G and the light-emitting layer 24B, which contain quantum dots (QDs) and do not contain a photosensitive resin, can also be formed in the same manner.

The manufacturing process of the display device 1 includes a step of forming the multiple first electrodes 22 on the substrate 2 including the transistors TR (illustrated in (a) of FIG. 7), a light-emitting layer forming step including a first light-emitting layer forming step of forming the light-emitting layer 24R on some of the multiple first electrodes 22 (illustrated in (d) of FIG. 7), a second light-emitting layer forming step of forming the light-emitting layer 24G on some other of the multiple first electrodes 22 (not illustrated), and a third light-emitting layer forming step of forming the light-emitting layer 24B on remains of the multiple first electrodes 22 (not illustrated), and a step of providing the protruding portions (24RD, 24GD, and 24BD) in the regions between the multiple first electrodes 22 (illustrated in (d) of FIG. 7). Then, after the step of providing the protruding portions (24RD, 24GD, and 24BD), the manufacturing process includes, on the protruding portions (24RD, 24GD, and 24BD), a charge transfer layer forming step of forming the charge transfer layer 25 including the thin film portions 25TP thinner than portions on the multiple first electrodes 22 and portions other than portions on the protruding portions (24RD, 24GD, and 24BD) in the regions between the multiple first electrodes 22 as a continuous film in the display region DA including the multiple first electrodes 22 and the regions between the multiple first electrodes 22 on the substrate 2 including the transistors TR (illustrated in (f) of FIG. 7), and a step of forming the second electrode 26 (illustrated in (h) of FIG. 7).

In the charge transfer layer forming step (illustrated in (f) of FIG. 7), the charge transfer layer 25 can be formed using, for example, a solution containing fine particles having charge transferability and a solvent.

Since the display device 1 of the present embodiment includes the edge cover layer 23, between the step of forming the first electrodes 22 (illustrated in (a) of FIG. 7) and the light-emitting layer forming step (partially illustrated in (d) of FIG. 7), a step of forming the edge cover layer 23 covering the edges of the multiple first electrodes 22 (illustrated in (a) of FIG. 7) is further included. In the step of providing the protruding portions (24RD, 24GD, and 24BD) (partially illustrated in (d) of FIG. 7), the protruding portions (24RD, 24GD, and 24BD) are provided on the edge cover layer 23.

In the method of manufacturing the display device 1 of the present embodiment, the first light-emitting layer forming step of forming the light-emitting layer 24R and the step of providing the protruding portion 24RD with the light-emitting layer 24R are performed simultaneously, the second light-emitting layer forming step of forming the light-emitting layer 24G and the step of providing the protruding portion 24GD with the light-emitting layer 24G are performed simultaneously, and the third light-emitting layer forming step of forming the light-emitting layer 24B and the step of providing the protruding portion 24BD with the light-emitting layer 24B are performed simultaneously. As illustrated in (d) of FIG. 7, the light-emitting layer 24R, the light-emitting layer 24G, and the light-emitting layer 24B may be formed up to the regions between the multiple first electrodes 22, respectively, and the protruding portions (24RD, 24GD, and 24BD) may be provided in parts of the light-emitting layer 24R, the light-emitting layer 24G, and the light-emitting layer 24B formed in the regions between the multiple first electrodes 22, respectively.

In the display device 1 of the present embodiment, the protruding portions (24RD, 24GD, and 24BD) are provided at the edges of the light-emitting layer 24R, the light-emitting layer 24G, and the light-emitting layer 24B formed in the regions between the multiple first electrodes 22, respectively.

In the display device 1 of the present embodiment, the light-emitting layer 24R, the light-emitting layer 24G, and the light-emitting layer 24B are each patterned by a lift-off method using the photosensitive resist 30 in order to provide the protruding portions (24RD, 24GD, and 24BD) at the edges of the light-emitting layer 24R, the light-emitting layer 24G, and the light-emitting layer 24B, respectively. The photosensitive resist 30 is preferably, for example, a photosensitive resist having good wettability with a solution for forming the light-emitting layer, but is not limited thereto. For example, as illustrated in (b) of FIG. 7, the photosensitive resist 30 is formed on the entire surface of the substrate 2 including the transistors TR, and then exposed and developed to form the template 30R illustrated in (c) of FIG. 7. The template 30R has an opening at a position where the light-emitting layer 24R of the red subpixel RSP is formed, and has a shape that covers the entire surfaces of the green subpixel GSP and the blue subpixel BSP. Then, as illustrated in (d) of FIG. 7, a solution for forming the light-emitting layer 24R containing quantum dots (QDs) and not containing a photosensitive resin is formed on the entire surface of the substrate 2 including the transistors TR. At this time, at a portion where the template 30R and the solution for forming the light-emitting layer 24R are in contact, a pool of the solution for forming the light-emitting layer 24R is generated, and this portion forms the protruding portion 24RD. Thereafter, as illustrated in (e) of FIG. 7, the template 30R is peeled off to leave the light-emitting layer 24R including the protruding portion 24RD at a predetermined position of the red subpixel RSP.

Although not illustrated, a template for forming the light-emitting layer 24G including the protruding portion 24GD has an opening at a position where the light-emitting layer 24G of the green subpixel GSP is formed and has a shape that covers the entire surfaces of the red subpixel RSP and the blue subpixel BSP. A template for forming the light-emitting layer 24B including the protruding portion 24BD has an opening at a position where the light-emitting layer 24B of the blue subpixel BSP is formed and has a shape that covers the entire surfaces of the red subpixel RSP and the green subpixel GSP.

The method of manufacturing the display device 1 of the present embodiment may further include a crack creation step of causing cracks in at least portions of the charge transfer layer 25 on the protruding portions (24RD, 24GD, and 24BD) (illustrated in (g) of FIG. 7), which is performed after the charge transfer layer formation step (illustrated in (f) of FIG. 7).

The crack creation step (illustrated in (g) of FIG. 7) includes at least one of a step of vacuum drying the charge transfer layer 25, a step of heat treating the charge transfer layer 25, and a step of deforming the substrate 2. The step of deforming the substrate 2 means a step of mechanically and temporarily deforming the substrate 2.

Figure 8:
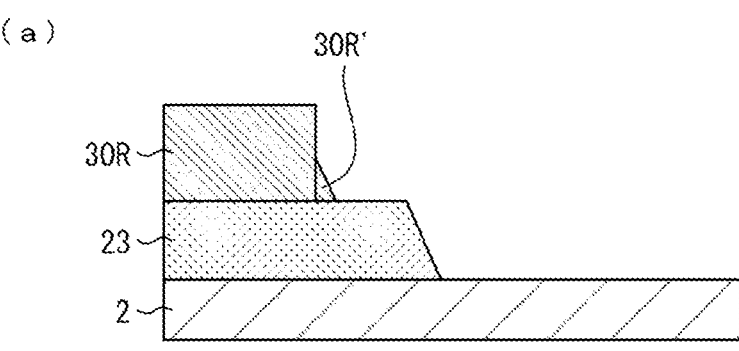
In FIG. 8, (a), (b), and (c) are diagrams illustrating an example of a step of forming a protruding portion in the display device according to a modified example of the first embodiment.
Figure 8:
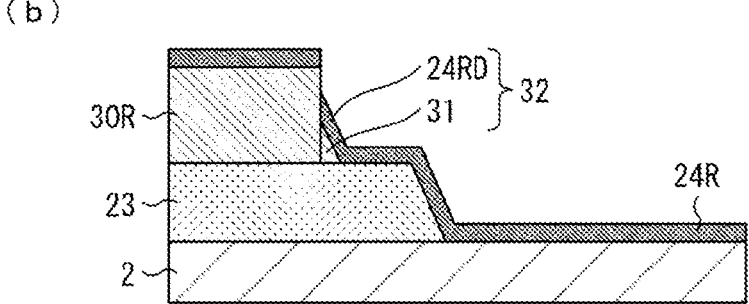
Figure 8:
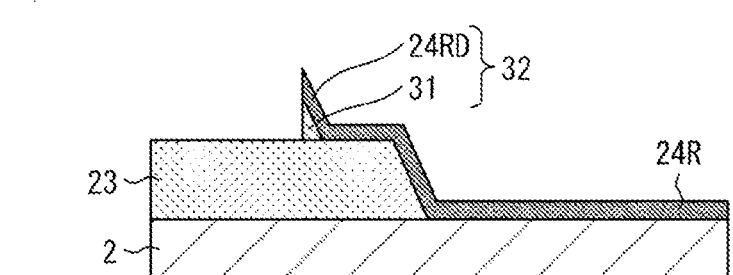

Each of (a) of FIG. 8, (b) of FIG. 8, and (c) of FIG. 8 is a diagram illustrating an example of a step of forming a protruding portion 32 in the display device according to a modified example of the first embodiment.

As illustrated in (a) of FIG. 8, when the photosensitive resist 30 is exposed and developed, a photosensitive resist residual portion 30R' may be generated in addition to the template 30R depending on exposure and developing conditions.

As illustrated in (b) of FIG. 8, when the solution for forming the light-emitting layer 24R containing quantum dots (QDs) and not containing a photosensitive resin is formed on the entire surface of the substrate 2 including the transistors TR in a state where the photosensitive resist residual portion 30R' is present in addition to the template 30R, some of the quantum dots (QDs) contained in the light-emitting layer 24R move into the photosensitive resist residual portion 30R' to form a photosensitive resin layer 31 containing the quantum dots (QDs).

As illustrated in (c) of FIG. 8, the resin layer 31 containing the quantum dots (QDs) is difficult to be peeled off when the template 30R is peeled off because the resin layer 31 contains the quantum dots (QDs), and a protruding portion (burr) 32 is formed by the protruding portion 24RD, which is the edge of the light-emitting layer 24R and the resin layer 31 containing the quantum dots (QDs).

Figure 9:
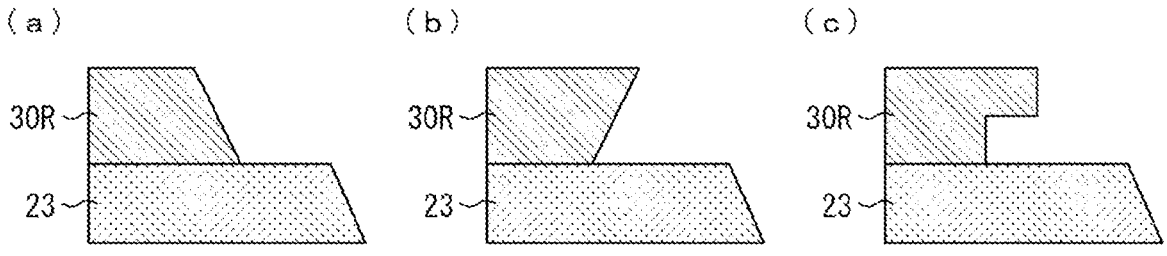
In FIG. 9, (a), (b), and (c) are diagrams illustrating an example of each shape of templates that can be used during a manufacturing process of the display device according to the first embodiment.

Each of (a) of FIG. 9, (b) of FIG. 9, and (c) of FIG. 9 is a diagram illustrating an example of each shape of the templates 30R that can be used during a manufacturing process of the display device 1 according to the first embodiment.

An edge of the template 30R, which is the portion in contact with the solution forming the light-emitting layer containing the quantum dots (QDs) and not containing the photosensitive resin, may be formed into a forward tapered shape as illustrated in (a) of FIG. 9, may be formed into a reverse tapered shape as illustrated in (b) of FIG. 9, or may be formed into a T-shape as illustrated in (c) of FIG. 9. When forming the template shape into a T-shape, the edge of the template 30R may be formed by layering a photosensitive resin on an alkali-soluble resin or water-soluble resin and etching the alkali-soluble resin or water-soluble resin using the photosensitive resin as a mask.

Figure 10:
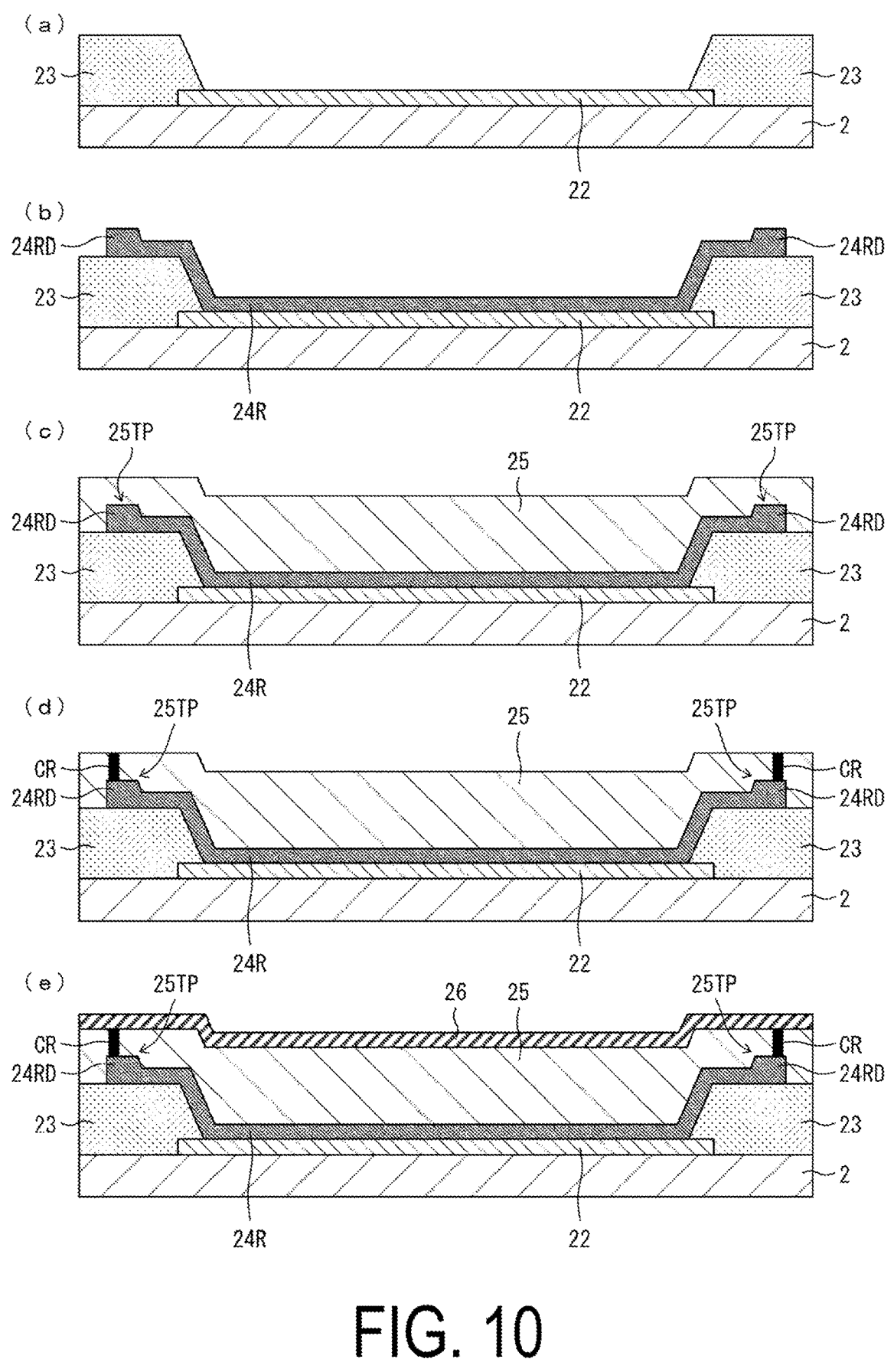

Each of (a) of FIG. 10, (b) of FIG. 10, (c) of FIG. 10, (d) of FIG. 10, and (e) of FIG. 10 is a diagram illustrating an example of another manufacturing process of the display device 1 according to the first embodiment.

With reference to FIG. 10, a description will be given of a case in which the light-emitting layer 24R containing quantum dots (QDs) and a photosensitive resin is patterned by exposing and developing. Although only a case of forming the light-emitting layer 24R is illustrated, the light-emitting layer 24G and the light-emitting layer 24B, which contain quantum dots (QDs) and a photosensitive resin, can also be formed in the same manner.

A step illustrated in (a) of FIG. 10 is the same as the step illustrated in (a) of FIG. 7, a step illustrated in (c) of FIG. 10 is the same as the step illustrated in (f) of FIG. 7, a step illustrated in (d) of FIG. 10 is the same as the step illustrated in (g) of FIG. 7, and a step illustrated in (e) of FIG. 10 is the same as the step illustrated in (h) of FIG. 7, so the description thereof will be omitted.

The photosensitive resin contained in the light-emitting layer 24R may be positive photosensitive resin or negative photosensitive resin. As illustrated in (b) of FIG. 10, by exposing the protruding portion 24RD and a portion other than the protruding portion 24RD of the light-emitting layer 24R with different exposure amounts using a halftone mask (gray-tone mask) and developing the exposed portions, the protruding portion 24RD can be formed simultaneously with the patterning of the light-emitting layer 24R. Here, the case in which the protruding portion 24RD is provided at the edge of the light-emitting layer 24R is described as an example, but the position of the protruding portion 24RD is not limited thereto, and the protruding portion 24RD may be provided at part of the light-emitting layer 24R formed in the region between the multiple first electrodes 22.

As the photosensitive resist 30 and the photosensitive resin, for example, photosensitive resins such as acrylic, novolac, rubber, styrene, and epoxy resins can be used.

In the steps of developing the photosensitive resist 30 and developing the photosensitive resin, for example, an inorganic alkaline aqueous developing solution such as KOH or NaOH may be used, an organic alkaline aqueous developing solution such as TMAH may be used, or a solvent developing solution such as PGME, PGMEA, Acetone, NMP, DMSO, IPA, EtOH, or Xylene may be used.

Second Embodiment

Next, with reference to FIG. 11, a second embodiment of the disclosure will be described. A display device 1a of the present embodiment is different from the above-described first embodiment in that each of a light-emitting layer 24R, a light-emitting layer 24G, and a light-emitting layer 24B is formed as one continuous film in a stripe shape and protruding portions are also formed in stripe shapes. The others are as described in the first embodiment. For convenience of description, members having the same functions as those illustrated in diagrams of the first embodiment are denoted by the same reference signs, and descriptions thereof are omitted.

Figure 11:
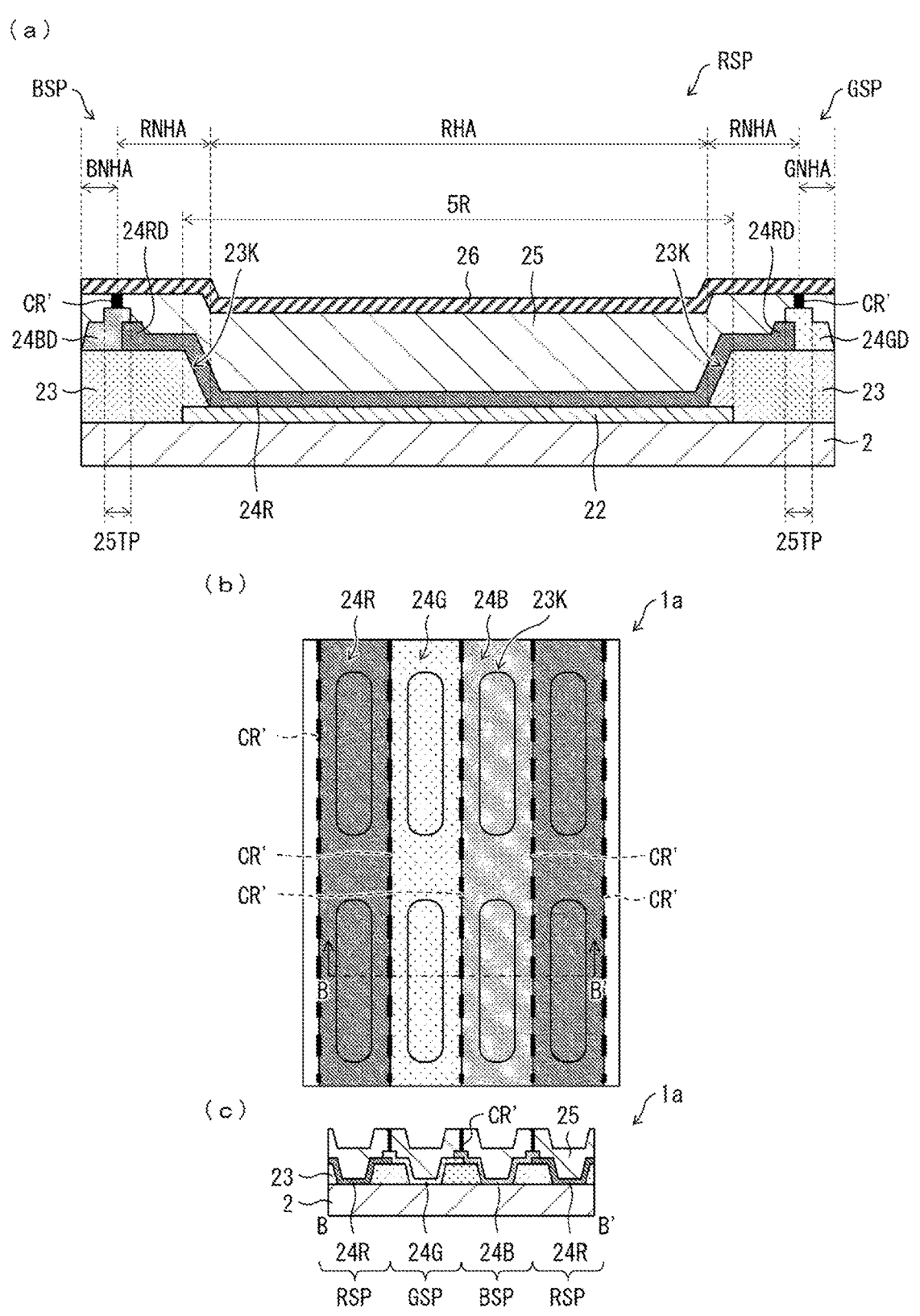
In FIG. 11, (a) is a cross-sectional view illustrating a schematic configuration of a red subpixel, part of a green subpixel adjacent to the red subpixel, and part of a blue subpixel adjacent to the red subpixel provided in a display device according to a second embodiment, (b) is a plan view of the display device according to the second embodiment illustrating positions where cracks occur, and (c) is a cross-sectional view taken along line B-B' illustrated in (b).

(a) of FIG. 11 is a cross-sectional view illustrating a schematic configuration of a red subpixel RSP, part of a green subpixel GSP adjacent to the red subpixel RSP, and part of a blue subpixel BSP adjacent to the red subpixel RSP, provided in the display device 1a according to the second embodiment, (b) of FIG. 11 is a plan view of the display device 1a according to the second embodiment illustrating positions where cracks CR' occur, and (c) of FIG. 11 is a cross-sectional view taken along line B-B' illustrated in (b) of FIG. 11.

In the display device 1a of the present embodiment, as already described with reference to FIG. 7 in the first embodiment, a template 30R having a predetermined shape is formed using a photosensitive resist 30, and then a light-emitting layer containing quantum dots (QDs) and not containing a photosensitive resin is patterned by a lift-off method using the template 30R, but the manufacturing process is not limited thereto.

As illustrated in (b) of FIG. 11, in the display device 1a, a light-emitting element 5R, a second light-emitting element 5G, and a third light-emitting element 5B are arranged adjacent to each other in a first direction (horizontal direction in (b) of FIG. 11) of a substrate 2 including transistors TR, and the light-emitting elements 5R are arranged adjacent to each other, the light-emitting elements 5G are arranged adjacent to each other, and the light-emitting elements 5B are arranged adjacent to each other in a second direction (vertical direction in (b) of FIG. 11) perpendicular to the first direction.

As illustrated in (a) of FIG. 11, a light-emitting layer 24R is formed in a light-emitting region RHA of the light-emitting element 5R and a non-light-emitting region RNHA that is a peripheral portion of the light-emitting region RHA of the light-emitting element 5R, and is formed as one continuous film in a stripe shape in the second direction (vertical direction in (b) of FIG. 11).

A light-emitting layer 24G is formed in a light-emitting region GHA (not illustrated) of the light-emitting element 5G and a non-light-emitting region GNHA (illustrated in (a) of FIG. 11) that is a peripheral portion of the light-emitting region GHA of the light-emitting element 5G, and is formed as one continuous film in a stripe shape in the second direction (vertical direction in (b) of FIG. 11).

A light-emitting layer 24B is formed in a light-emitting region BHA (not illustrated) of the light-emitting element 5B and a non-light-emitting region BNHA (illustrated in (a) of FIG. 11) that is a peripheral portion of the light-emitting region BHA of the light-emitting element 5B, and is formed as one continuous film in a stripe shape in the second direction (vertical direction in (b) of FIG. 11).

As illustrated in (a) of FIG. 11, a boundary between the red subpixel RSP and the green subpixel GSP is a boundary between the non-light-emitting region RNHA that is the peripheral portion of the light-emitting region RHA of the light-emitting element 5R, and the non-light-emitting region GNHA that is the peripheral portion of the light-emitting region GHA of the light-emitting element 5G, and a boundary between the red subpixel RSP and the blue subpixel BSP is a boundary between the non-light-emitting region RNHA that is the peripheral portion of the light-emitting region RHA of the light-emitting element 5R, and the non-light-emitting region BNHA that is the peripheral portion of the light-emitting region BHA of the light-emitting element 5B. Thin film portions 25TP of a charge transfer layer 25 are formed at a boundary portion between the red subpixel RSP and the green subpixel GSP and at a boundary portion between the red subpixel RSP and the blue subpixel BSP.

As illustrated in (a) of FIG. 11, (b) of FIG. 11, and (c) of FIG. 11, each of the protruding portions provided in the non-light-emitting regions (RNHA, GNHA, and BNHA) along the second direction includes a portion in which one of the protruding portion 24RD, which is an edge of the light-emitting layer 24R in the first direction, the protruding portion 24GD, which is an edge of the light-emitting layer 24G in the first direction, and the protruding portion 24BD, which is an edge of the light-emitting layer 24B in the first direction, and another of the protruding portion 24RD, which is the edge of the light-emitting layer 24R in the first direction, the protruding portion 24GD, which is the edge of the light-emitting layer 24G in the first direction, and the protruding portion 24B, which is the edge of the light-emitting layer 24BD in the first direction are layered.

At the boundary portion between the red subpixel RSP and the green subpixel GSP, a protruding portion including a portion in which the protruding portion 24RD, which is the edge of the light-emitting layer 24R in the first direction, and the protruding portion 24GD, which is the edge of the light-emitting layer 24G in the first direction, are layered is formed in the non-light-emitting region in a stripe shape along the second direction.

At the boundary portion between the green subpixel GSP and the blue subpixel BSP, a protruding portion including a portion in which the protruding portion 24GD, which is the edge of the light-emitting layer 24G in the first direction, and the protruding portion 24BD, which is the edge of the light-emitting layer 24B in the first direction, are layered is formed in the non-light-emitting region in a stripe shape along the second direction.

At the boundary portion between the blue subpixel BSP and the red subpixel RSP, a protruding portion including a portion in which the protruding portion 24BD, which is the edge of the light-emitting layer 24B in the first direction, and the protruding portion 24RD, which is the edge of the light-emitting layer 24R in the first direction, are layered is formed in the non-light-emitting region in a stripe shape along the second direction.

As described above, by forming the protruding portion by layering two kinds of light-emitting layers, a height of the protruding portion can be easily increased as compared with the case where the protruding portion is formed by one kind of light-emitting layer. Therefore, a thickness of the thin film portion 25TP of the charge transfer layer 25 can be further reduced, so that the positions where the cracks CR' occur can be more reliably limited to the thin film portion 25TP of the charge transfer layer 25.

In addition, in the display device 1a, as illustrated in (b) of FIG. 11, the cracks CR' are also formed in a stripe shape along the second direction along the shape of the formed protruding portion, so that resistance can be lowered as the cracks CR' are not formed in the first direction.

In a method of manufacturing the display device 1a, a step of forming the light-emitting layer 24R and a step of providing the protruding portion 24RD with the light-emitting layer 24R are performed simultaneously, a step of forming the light-emitting layer 24G and a step of providing the protruding portion 24GD with the light-emitting layer 24G are performed simultaneously, a step of forming the light-emitting layer 24B and a step of providing the protruding portion 24BD with the light-emitting layer 24B are performed simultaneously, and two of the protruding portion 24RD of the light-emitting layer 24R, the protruding portion 24GD of the light-emitting layer 24G, and the protruding portion 24BD of the light-emitting layer 24B may be layered in a region between the multiple first electrodes 22.

Third Embodiment

Next, a third embodiment according to the disclosure will be described with reference to FIG. 12 to FIG. 16. A display device 1b of the present embodiment is different from the above-described first and second embodiments in that a protruding portion provided in a non-light-emitting region is formed by layering a light-emitting layer 24R, a light-emitting layer 24G, and a light-emitting layer 24B. The others are as described in the first and second embodiments. For convenience of description, members having the same functions as the members illustrated in the diagrams in the first and second embodiments are denoted by the same reference signs, and descriptions thereof will be omitted.

Figure 12:
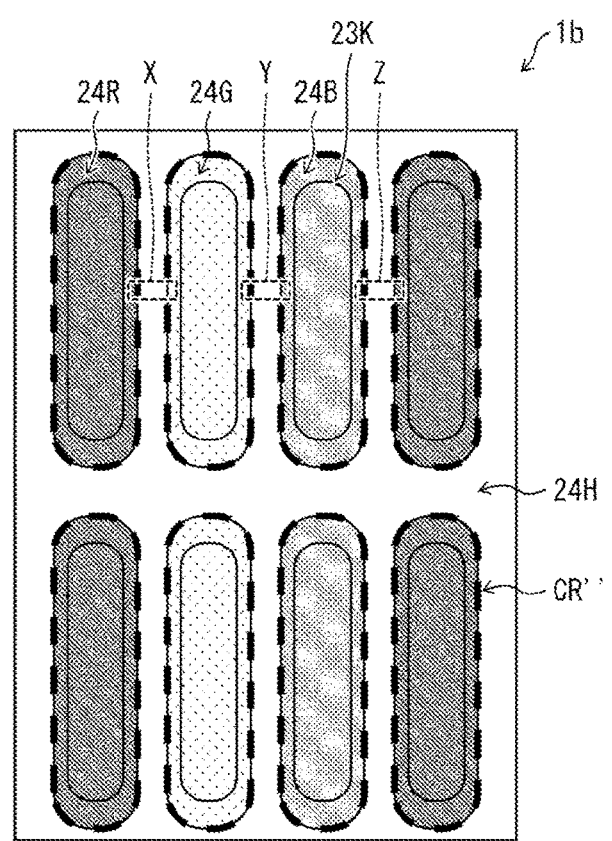
FIG. 12 is a plan view of a display device according to a third embodiment illustrating positions where cracks occur.

FIG. 12 is a plan view of the display device 1b of the third embodiment illustrating positions where cracks CR" occur.

Figure 13:
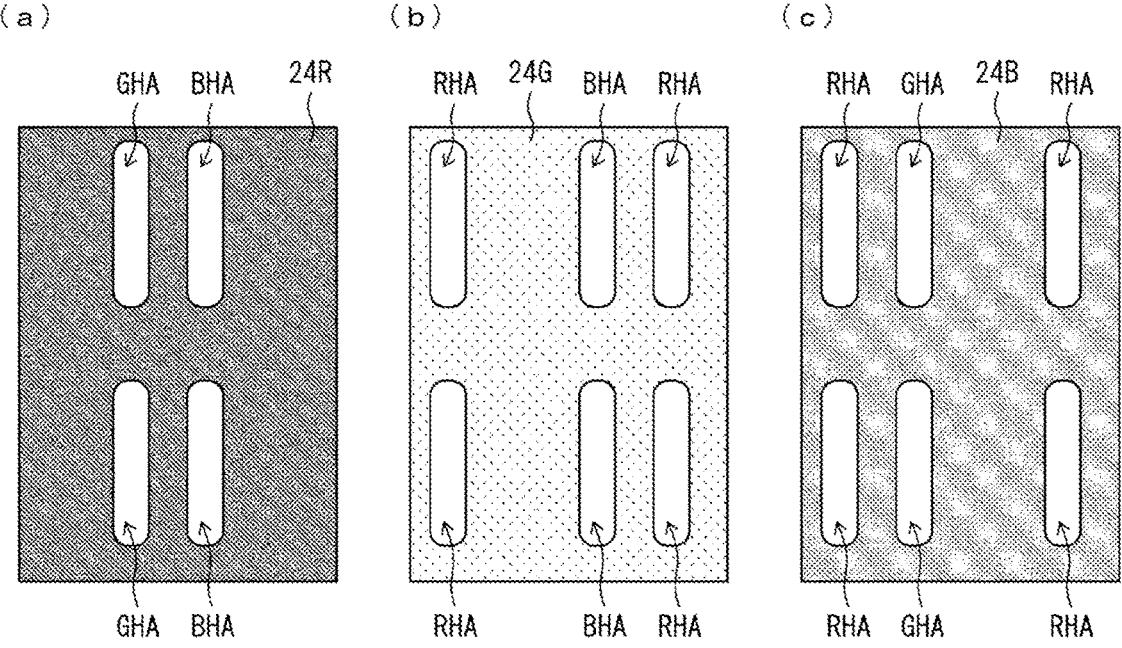
In FIG. 13, (a) is a diagram illustrating an example of a shape of a red light-emitting layer that can be provided in the display device according to the third embodiment, (b) is a diagram illustrating an example of a shape of a green light-emitting layer that can be provided in the display device according to the third embodiment, and (c) is a diagram illustrating an example of a shape of a blue light-emitting layer that can be provided in the display device according to the third embodiment.

(a) of FIG. 13 is a diagram illustrating an example of a shape of the light-emitting layer (red light-emitting layer) 24R that can be provided in the display device 1b of the third embodiment, (b) of FIG. 13 is a diagram illustrating an example of a shape of the light-emitting layer (green light-emitting layer) 24G that can be provided in the display device 1b of the third embodiment, and (c) of FIG. 13 is a diagram illustrating an example of a shape of the light-emitting layer (blue light-emitting layer) 24B that can be provided in the display device 1b of the third embodiment.

Figure 14:
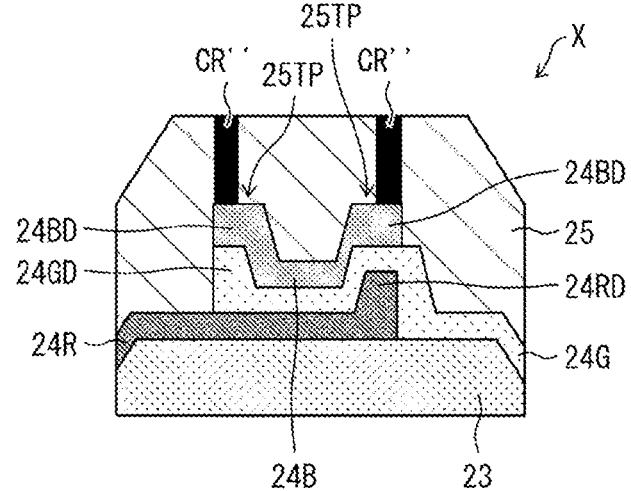
In FIG. 14, (a) is a cross-sectional view of a portion X illustrated in FIG. 12, (b) is a cross-sectional view of a portion Y illustrated in FIG. 12, and (c) is a cross-sectional view of a portion Z illustrated in FIG. 12.
Figure 14:
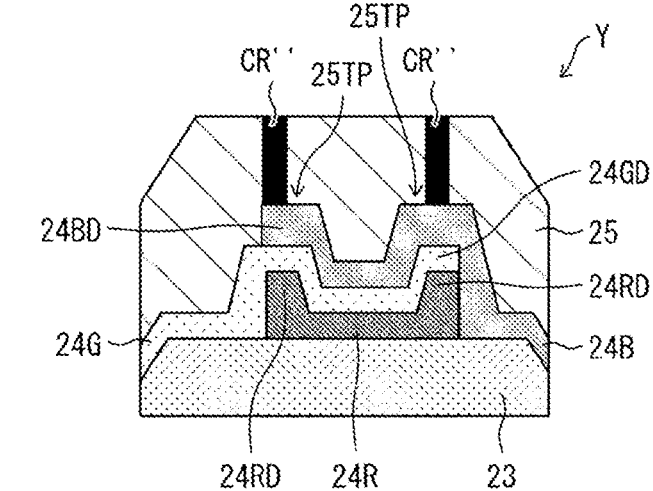
Figure 14:
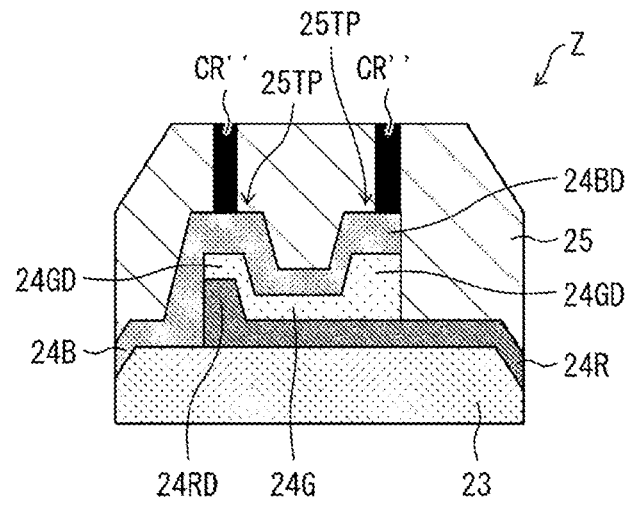

(a) of FIG. 14 is a cross-sectional view of a portion X illustrated in FIG. 12, (b) of FIG. 14 is a cross-sectional view of a portion Y illustrated in FIG. 12, and (c) of FIG. 14 is a cross-sectional view of a portion Z illustrated in FIG. 12.

In the display device 1b of the present embodiment, as already described with reference to FIG. 7 in the first embodiment, a template 30R having a predetermined shape is formed using a photosensitive resist 30, and then a light-emitting layer containing quantum dots (QDs) and not containing a photosensitive resin is patterned by a lift-off method using the template 30R, but the manufacturing process is not limited thereto.

In the display device 1b of the present embodiment, the protruding portion is provided so as to surround light-emitting regions, as illustrated in FIG. 12, the cracks CR" are provided so as to surround the light-emitting regions. Therefore, color mixing with adjacent emitted light of another color due to the cracks CR" can be suppressed.

As illustrated in (a) of FIG. 13, the light-emitting layer 24R that can be provided in the display device 1b needs to be formed in regions excluding at least a light-emitting region GHA of the green light-emitting element 5G and a light-emitting region BHA of the blue light-emitting element 5B, as illustrated in (b) of FIG. 13, the light-emitting layer 24G that can be provided in the display device 1b needs to be formed in regions excluding at least a light-emitting region RHA of the red light-emitting element 5R and the light-emitting region BHA of the blue light-emitting element 5B, and as illustrated in (c) of FIG. 13, the light-emitting layer 24B that can be provided in the display device 1b needs to be formed in regions excluding at least the light-emitting region RHA of the red light-emitting element 5R and the light-emitting region GHA of the green light-emitting element 5G. In the present embodiment, the light-emitting layer 24R is formed in regions excluding the light-emitting region GHA of the green light-emitting element 5G and part of a non-light-emitting region GNHA contiguous from the light-emitting region GHA and in regions excluding the light-emitting region BHA of the blue light-emitting element 5B and part of a non-light-emitting region BNHA contiguous from the light-emitting region BHA, the light-emitting layer 24G is formed in regions excluding the light-emitting region RHA of the red light-emitting element 5R and part of a non-light-emitting region RNHA contiguous from the light-emitting region RHA and in regions excluding the light-emitting region BHA of the blue light-emitting element 5B and part of the non-light-emitting region BNHA contiguous from the light-emitting region BHA, and the light-emitting layer 24B is formed in regions excluding the light-emitting region RHA of the red light-emitting element 5R and part of the non-light-emitting region RNHA contiguous from the light-emitting region RHA and in regions excluding the light-emitting region GHA of the green light-emitting element 5G and part of the non-light-emitting region GNHA contiguous from the light-emitting region GHA. Therefore, in the display device 1b, as illustrated in FIG. 12, a layered body 24H is formed by layering the light-emitting layer 24R, the light-emitting layer 24G, and the light-emitting layer 24B.

As illustrated in (a) of FIG. 14, in the portion X illustrated in FIG. 12, which is the non-light-emitting region between the red subpixel RSP and the green subpixel GSP, the light-emitting layer 24R, the light-emitting layer 24G, and the light-emitting layer 24B are layered to form the protruding portion.

In the present embodiment, the light-emitting layer 24R, the light-emitting layer 24G, and the light-emitting layer 24B are formed in this order, so the light-emitting layer 24R, the light-emitting layer 24G, and the light-emitting layer 24B are layered in this order to form the protruding portion. However, the formation order is not limited to this, and by changing the formation order of the light-emitting layer 24R, the light-emitting layer 24G, and the light-emitting layer 24B, the layering order can also be changed.

Further, in the present embodiment, as described above, the template 30R having a predetermined shape is formed using the photosensitive resist 30, and then the light-emitting layer 24R, the light-emitting layer 24G, and the light-emitting layer 24B are patterned by the lift-off method using the template 30R. Therefore, as illustrated in (a) of FIG. 14, a protruding portion 24RD of the light-emitting layer 24R is formed at a portion in contact with the template 30R (not illustrated) for forming the light-emitting layer 24R. As illustrated in (a) of FIG. 14, a protruding portion 24GD of the light-emitting layer 24G is formed at a portion in contact with a template (not illustrated) for forming the light-emitting layer 24G. The light-emitting layer 24G has, in addition to the protruding portion 24GD, a protruding portion higher than other portions at a portion that goes over the protruding portion 24RD of the light-emitting layer 24R. Further, as illustrated in (a) of FIG. 14, protruding portions 24BD of the light-emitting layer 24B are formed at portions in contact with a template (not illustrated) for forming the light-emitting layer 24B. The protruding portions 24BD of the light-emitting layer 24B have shapes in which the portions formed at a predetermined distance and in contact with the template (not illustrated) for forming the light-emitting layer 24B are higher than other portions.

As described above, two thin film portions 25TP of the charge transfer layer 25 can be formed in the non-light-emitting region between the red subpixel RSP and the green subpixel GSP of the display device 1b as illustrated in (a) of FIG. 14.

As illustrated in (b) of FIG. 14, in the portion Y illustrated in FIG. 12, which is the non-light-emitting region between the green subpixel GSP and the blue subpixel BSP, the light-emitting layer 24R, the light-emitting layer 24G, and the light-emitting layer 24B are layered to form the protruding portion.

As illustrated in (b) of FIG. 14, protruding portions 24RD of the light-emitting layer 24R are formed at portions in contact with the template (not illustrated) for forming the light-emitting layer 24R. The protruding portions 24RD of the light-emitting layer 24R have shapes in which the portions formed at a predetermined distance and in contact with the template (not illustrated) for forming the light-emitting layer 24R are higher than other portions. As illustrated in (b) of FIG. 14, a protruding portion 24GD of the light-emitting layer 24G is formed at a portion in contact with the template (not illustrated) for forming the light-emitting layer 24G. The light-emitting layer 24G has, in addition to the protruding portion 24GD, a protruding portion higher than other portions at a portion that goes over the protruding portion 24RD of the light-emitting layer 24R. Further, as illustrated in (b) of FIG. 14, a protruding portion 24BD of the light-emitting layer 24B is formed at a portion in contact with the template (not illustrated) for forming the light-emitting layer 24B. The light-emitting layer 24B has, in addition to the protruding portion 24BD, a protruding portion higher than other portions at a portion that goes over the protruding portion 24GD of the light-emitting layer 24G.

As described above, two thin film portions 25TP of the charge transfer layer 25 can be formed in the non-light-emitting region between the green subpixel GSP and the blue subpixel BSP of the display device 1b as illustrated in (b) of FIG. 14.

As illustrated in (c) of FIG. 14, in the portion Z illustrated in FIG. 12, which is the non-light-emitting region between the blue subpixel BSP and the red subpixel RSP, the light-emitting layer 24R, the light-emitting layer 24G, and the light-emitting layer 24B are layered to form the protruding portion.

As illustrated in (c) of FIG. 14, a protruding portion 24RD of the light-emitting layer 24R is formed in a portion in contact with the template 30R (not illustrated) for forming the light-emitting layer 24R. As illustrated in (c) of FIG. 14, protruding portions 24GD of the light-emitting layer 24G are formed at portions in contact with the template (not illustrated) for forming the light-emitting layer 24G. The protruding portions 24GD of the light-emitting layer 24G have shapes in which the portions formed at a predetermined distance and in contact with the template (not illustrated) for forming the light-emitting layer 24G are higher than other portions. Further, as illustrated in (c) of FIG. 14, a protruding portion 24BD of the light-emitting layer 24B is formed at a portion in contact with the template (not illustrated) for forming the light-emitting layer 24B. The light-emitting layer 24B has portions higher than other portions at the portion in contact with the template (not illustrated) for forming the light-emitting layer 24B and at a portion that goes over a portion where the protruding portion 24RD of the light-emitting layer 24R and the protruding portion 24GD of the light-emitting layer 24G are layered.

As described above, two thin film portions 25TP of the charge transfer layer 25 can be formed in the non-light-emitting region between the blue subpixel BSP and the red subpixel RSP of the display device 1b as illustrated in (c) of FIG. 14.

Figure 15:
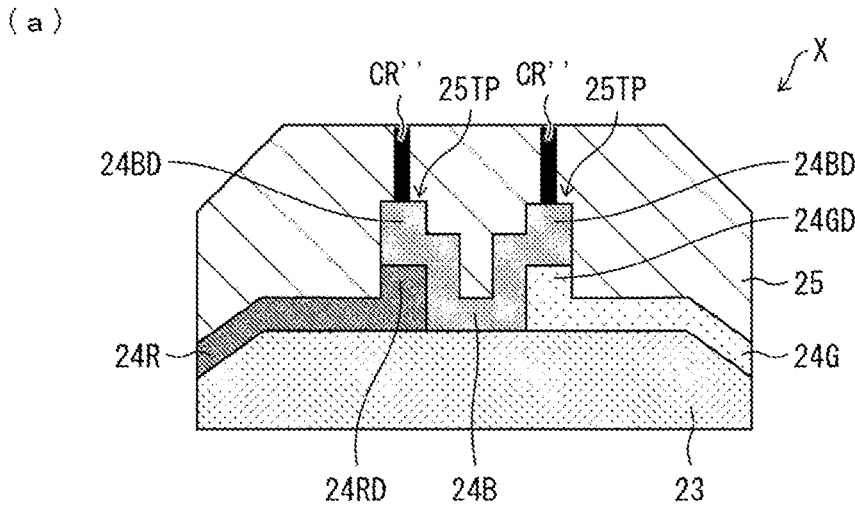
In FIG. 15, (a) is a cross-sectional view of the portion X illustrated in FIG. 12 according to a first modified example, (b) is a cross-sectional view of the portion Y illustrated in FIG. 12 according to the first modified example, and (c) is a cross-sectional view of the portion Z illustrated in FIG. 12 according to the first modified example.
Figure 15:
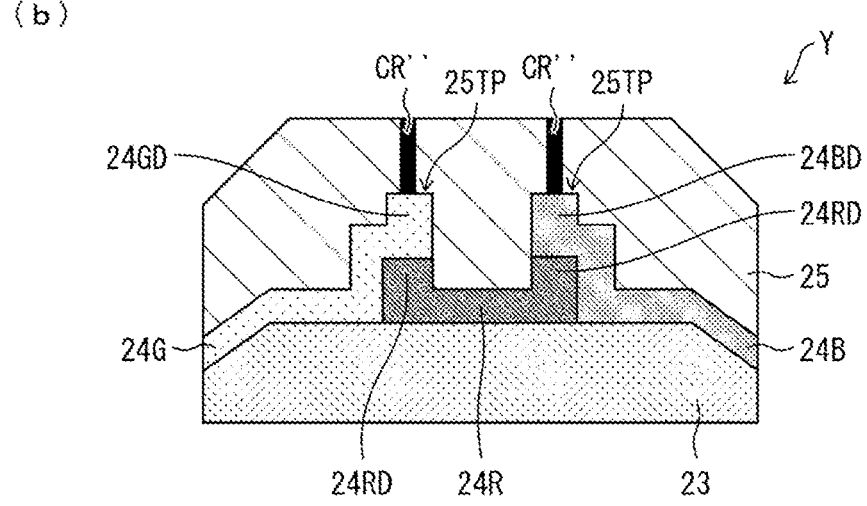
Figure 15:
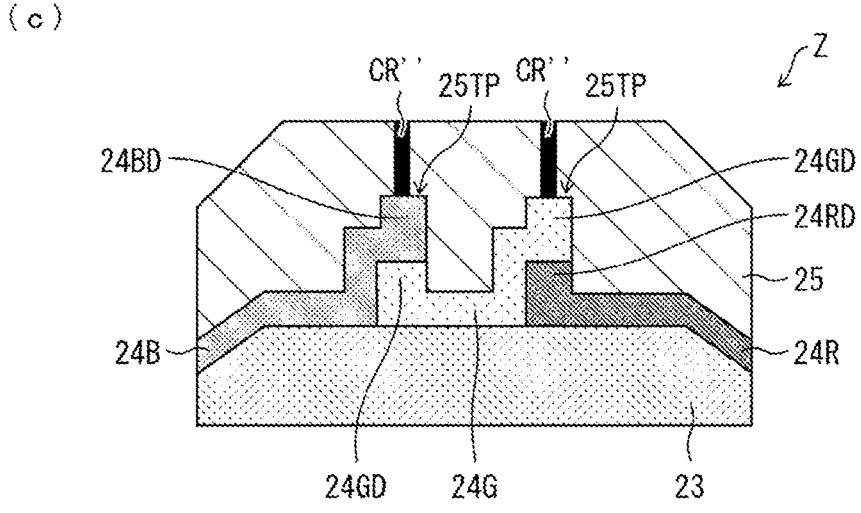

(a) of FIG. 15 is a cross-sectional view of the portion X illustrated in FIG. 12 according to a first modified example, (b) of FIG. 15 is a cross-sectional view of the portion Y illustrated in FIG. 12 according to the first modified example, and (c) of FIG. 15 is a cross-sectional view of the portion Z illustrated in FIG. 12 according to the first modified example.

As illustrated in (a) of FIG. 15, the light-emitting layer 24R and the light-emitting layer 24G may be formed with a space therebetween without being layered, and the light-emitting layer 24B may be formed so that the space is filled and the protruding portions 24BD of the light-emitting layer 24B are located on the protruding portion 24RD of the light-emitting layer 24R and the protruding portion 24GD of the light-emitting layer 24G, respectively. Also in this case, two thin film portions 25TP of the charge transfer layer 25 can be formed in the non-light-emitting region between the red subpixel RSP and the green subpixel GSP of the display device 1b.

As illustrated in (b) of FIG. 15, the protruding portion 24GD of the light-emitting layer 24G may be formed on the protruding portion 24RD on one side of the light-emitting layer 24R, and the protruding portion 24BD of the light-emitting layer 24B may be formed on the protruding portion 24RD on the other side of the light-emitting layer 24R. Also in this case, two thin film portions 25TP of the charge transfer layer 25 can be formed in the non-light-emitting region between the green subpixel GSP and the blue subpixel BSP of the display device 1b.

As illustrated in (c) of FIG. 15, the protruding portion 24GD on one side of the light-emitting layer 24G may be formed on the protruding portion 24RD of the light-emitting layer 24R, and the protruding portion 24BD of the light-emitting layer 24B may be formed on the protruding portion 24GD on the other side of the light-emitting layer 24G. Also in this case, two thin film portions 25TP of the charge transfer layer 25 can be formed in the non-light-emitting region between the blue subpixel BSP and the red subpixel RSP of the display device 1b.

Figure 16:
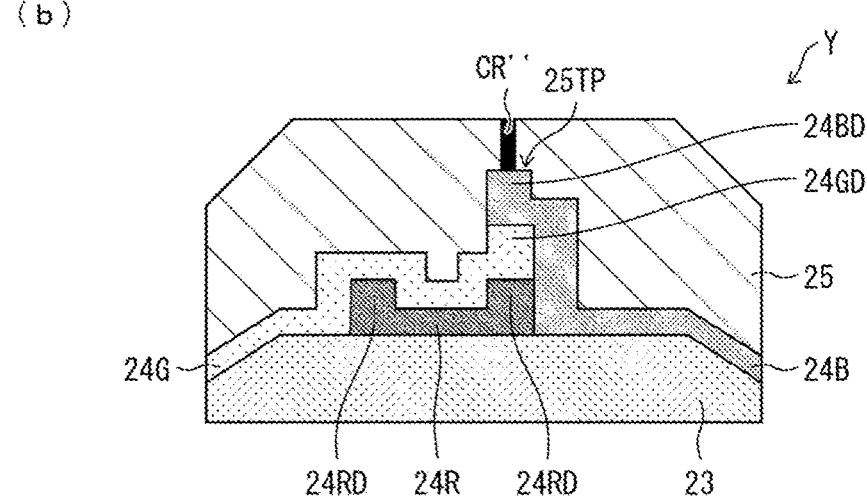
In FIG. 16, (a) is a cross-sectional view of the portion X illustrated in FIG. 12 according to a second modified example, (b) is a cross-sectional view of the portion Y illustrated in FIG. 12 according to the second modified example, and (c) is a cross-sectional view of the portion Z illustrated in FIG. 12 according to the second modified example.
Figure 16:
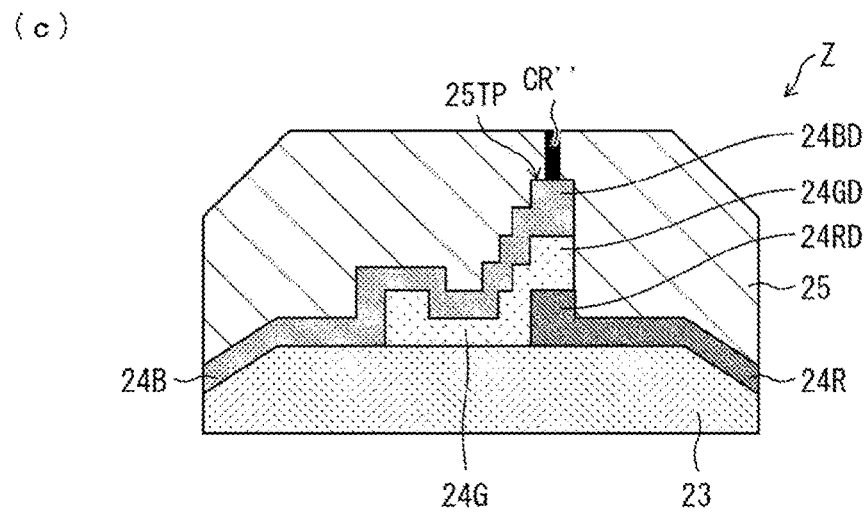

(a) of FIG. 16 is a cross-sectional view of the portion X illustrated in FIG. 12 according to a second modified example, (b) of FIG. 16 is a cross-sectional view of the portion Y illustrated in FIG. 12 according to the second modified example, and (c) of FIG. 16 is a cross-sectional view of the portion Z illustrated in FIG. 12 according to the second modified example.

As illustrated in (a) of FIG. 16, the protruding portion 24GD of the light-emitting layer 24G may be formed on the protruding portion 24RD of the light-emitting layer 24R, and the protruding portion 24BD of the light-emitting layer 24B may be formed on a portion where the protruding portion 24RD of the light-emitting layer 24R and the protruding portion 24GD of the light-emitting layer 24G are layered. In this manner, one thin film portion 25TP of the charge transfer layer 25 can be formed in the non-light-emitting region between the red subpixel RSP and the green subpixel GSP of the display device 1b.

As illustrated in (b) of FIG. 16, the protruding portion 24GD of the light-emitting layer 24G may be formed on the protruding portion 24RD on one side of the light-emitting layer 24R, and the protruding portion 24BD of the light-emitting layer 24B may be formed on a portion where the protruding portion 24RD of the light-emitting layer 24R and the protruding portion 24GD of the light-emitting layer 24G are layered. In this manner, one thin film portion 25TP of the charge transfer layer 25 can be formed in the non-light-emitting region between the green subpixel GSP and the blue subpixel BSP of the display device 1b.

As illustrated in (c) of FIG. 16, the protruding portion 24GD on one side of the light-emitting layer 24G may be formed on the protruding portion 24RD of the light-emitting layer 24R, and the protruding portion 24BD of the light-emitting layer 24B may be formed on a portion where the protruding portion 24RD of the light-emitting layer 24R and the protruding portion 24GD of the light-emitting layer 24G are layered. In this manner, one thin film portion 25TP of the charge transfer layer 25 can be formed in the non-light-emitting region between the blue subpixel BSP and the red subpixel RSP of the display device 1b.

In the display device 1b, by forming the thin film portion 25TP of the charge transfer layer 25 by layering the protruding portions of multiple types of light-emitting layers, a height of the protruding portion can be easily increased as compared with the case where the protruding portion is formed by one type of light-emitting layer. Therefore, a thickness of the thin film portion 25TP of the charge transfer layer 25 can be further reduced, so that the positions where the cracks CR" occur can be more reliably limited to the thin film portion 25TP of the charge transfer layer 25.

In a method of manufacturing the display device 1b, a step of forming the light-emitting layer 24R and a step of providing the protruding portion with the light-emitting layer 24R are performed simultaneously, a step of forming the light-emitting layer 24G and a step of providing the protruding portion with the light-emitting layer 24G are performed simultaneously, a step of forming the light-emitting layer 24B and a step of providing the protruding portion with the light-emitting layer 24B are performed simultaneously, and the protruding portion of the light-emitting layer 24R, the protruding portion of the light-emitting layer 24G, and the protruding portion of the light-emitting layer 24B may be layered in the region between the multiple first electrodes 22.

Fourth Embodiment

Next, a fourth embodiment of the disclosure will be described with reference to FIG. 17. A display device 1c of the present embodiment is different from the above-described first to third embodiments in that a protruding portion 23P is part of an edge cover layer 23 and a charge transfer layer 25 is located below a light-emitting layer 24R. The others are as described in the first to third embodiments. For convenience of description, members having the same functions as those of the members illustrated in the drawings in the first to third embodiments are denoted by the same reference numerals, and descriptions thereof will be omitted.

Figure 17:
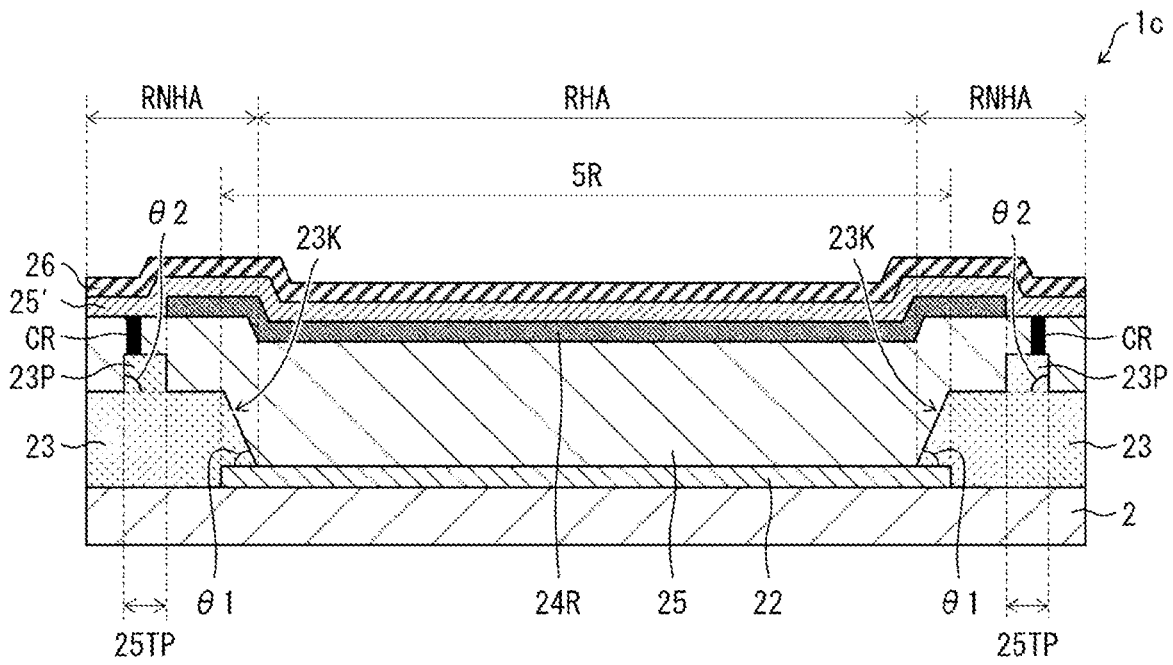
FIG. 17 is a cross-sectional view illustrating a schematic configuration of a red subpixel provided in a display device according to a fourth embodiment.

FIG. 17 is a cross-sectional view illustrating a schematic configuration of a red subpixel RSP provided in the display device 1c of the fourth embodiment.

As illustrated in FIG. 17, in the display device 1c, the protruding portion 23P is formed by part of the edge cover layer 23, and the charge transfer layer 25 is a layer lower than the light-emitting layer 24R.

A method of manufacturing the display device 1c of the present embodiment includes a step of forming the protruding portion 23P prior to a light-emitting layer forming step, and a charge transfer layer forming step in which, between the step of forming the protruding portion 23P and the light-emitting layer forming step, on the protruding portion 23P, the charge transfer layer 25 including a thin film portion 25TP thinner than portions on multiple first electrodes 22 and portions other than the portion on the protruding portion 23P in the region between the multiple first electrodes 22 is formed as a continuous film in the display region on a substrate 2 that includes the multiple first electrodes 22 and a region between the multiple first electrodes 22.

In the display device 1c including the charge transfer layer 25 including the thin film portion 25TP in part of a non-light-emitting region, shrinkage of the charge transfer layer 25, which is one continuous film, during the step of forming the charge transfer layer 25 causes stress to be inherent in the charge transfer layer 25 and cracks CR may occur based on unintended triggers. However, positions where the cracks CR occur can be limited to the thin film portion 25TP of the charge transfer layer 25.

As described above, in the display device 1c, cracks CR in the charge transfer layer 25 in a light-emitting region of a light-emitting element can be suppressed, thereby suppressing deterioration in display quality.

In the display device 1c, when the charge transfer layer 25 is, for example, an electron transport layer, a second charge transfer layer 25' is, for example, a hole transport layer.

Further, the protruding portion 23P may be used to create cracks CR in the second charge transfer layer 25'. Alternatively, the cracks CR may be generated in both the charge transfer layer 25 and the second charge transfer layer 25'.

Supplement

First Aspect

A display device including a substrate, and on the substrate, a light-emitting element including a first electrode, a second electrode, and a light-emitting layer and a charge transfer layer between the first electrode and the second electrode, in which the display device includes a light-emitting region of the light-emitting element and a non-light-emitting region being a peripheral portion of the light-emitting region, a protruding portion is provided in a layer lower than the charge transfer layer in part of the non-light-emitting region, and the charge transfer layer is formed as a continuous film in a display region including the light-emitting region and the non-light-emitting region on the substrate, and includes a thin film portion, on the protruding portion, being thinner than a portion in the light-emitting region and a portion in the non-light-emitting region other than the protruding portion.

Second Aspect

The display device according to a first aspect, further including an edge cover layer configured to cover an edge of the first electrode, in which the protruding portion is provided on the edge cover layer.

Third Aspect

The display device according to a second aspect, in which an angle formed by an edge of the protruding portion and a lower face of the protruding portion is larger than an angle formed by a side surface of the edge cover layer forming an opening configured to expose part of the first electrode and a lower face of the edge cover layer provided on the first electrode.

Fourth Aspect

The display device according to any one of the first to third aspects, in which the light-emitting layer is formed in the light-emitting region and the non-light-emitting region, and the protruding portion is part of the light-emitting layer formed in the non-light-emitting region.

Fifth Aspect

The display device according to a fourth aspect, in which the light-emitting layer is formed in the light-emitting region and the non-light-emitting region, and the protruding portion is an edge of the light-emitting layer formed in the non-light-emitting region.

Sixth Aspect

The display device according to any one of the first to third aspects, in which multiple light-emitting elements are provided, the multiple light-emitting elements include a first light-emitting element including a first light-emitting layer as the light-emitting layer, a second light-emitting element including a second light-emitting layer as the light-emitting layer, and a third light-emitting element including a third light-emitting layer as the light-emitting layer, in a first direction of the substrate, the first light-emitting element, the second light-emitting element, and the third light-emitting element are arranged adjacent to each other, the first light-emitting layer is formed in a light-emitting region of the first light-emitting element, part of a non-light-emitting region being a peripheral portion of the light-emitting region of the first light-emitting element, part of a non-light-emitting region being a peripheral portion of a light-emitting region of the second light-emitting element, and part of a non-light-emitting region being a peripheral portion of a light-emitting region of the third light-emitting element, the second light-emitting layer is formed in the light-emitting region of the second light-emitting element, part of the non-light-emitting region being the peripheral portion of the light-emitting region of the first light-emitting element, part of the non-light-emitting region being the peripheral portion of the light-emitting region of the second light-emitting element, and part of the non-light-emitting region being the peripheral portion of the light-emitting region of the third light-emitting element, the third light-emitting layer is formed in the light-emitting region of the third light-emitting element, part of the non-light-emitting region being the peripheral portion of the light-emitting region of the first light-emitting element, part of the non-light-emitting region being the peripheral portion of the light-emitting region of the second light-emitting element, and part of the non-light-emitting region being the peripheral portion of the light-emitting region of the third light-emitting element, and the protruding portion provided in the non-light-emitting region is formed by layering at least two layers of the first light-emitting layer, the second light-emitting layer, and the third light-emitting layer.

Seventh Aspect

The display device according to any one of the third to sixth aspects, in which the protruding portion surrounds the light-emitting region.

Eighth Aspect

The display device according to any one of the first to third aspects, in which multiple light-emitting elements are provided, the multiple light-emitting elements include first light-emitting elements, each of the first light-emitting elements including a first light-emitting layer as the light-emitting layer, second light-emitting elements, each of the second light-emitting elements including a second light-emitting layer as the light-emitting layer, and third light-emitting elements, each of the third light-emitting elements including a third light-emitting layer as the light-emitting layer, in a first direction of the substrate, each of the first light-emitting elements, each of the second light-emitting elements, and each of the third light-emitting elements are arranged adjacent to each other, in a second direction of the substrate orthogonal to the first direction, the first light-emitting elements are arranged adjacent to each other, the second light-emitting elements are arranged adjacent to each other, and the third light-emitting elements are arranged adjacent to each other, the first light-emitting layer is formed in a light-emitting region of each of the first light-emitting elements and a non-light-emitting region being a peripheral portion of the light-emitting region of each of the first light-emitting elements, and is formed as one continuous film in a stripe shape in the second direction of the substrate, the second light-emitting layer is formed in a light-emitting region of each of the second light-emitting elements and a non-light-emitting region being a peripheral portion of the light-emitting region of each of the second light-emitting elements, and is formed as one continuous film in a stripe shape in the second direction of the substrate, the third light-emitting layer is formed in a light-emitting region of each of the third light-emitting elements and a non-light-emitting region being a peripheral portion of the light-emitting region of each of the third light-emitting elements, and is formed as one continuous film in a stripe shape in the second direction of the substrate, and the protruding portion provided in the non-light-emitting region along the second direction includes a portion in which one of an edge of the first light-emitting layer in the first direction, an edge of the second light-emitting layer in the first direction, and an edge of the third light-emitting layer in the first direction is layered with another of the edge of the first light-emitting layer in the first direction, the edge of the second light-emitting layer in the first direction, and the edge of the third light-emitting layer in the first direction.

Ninth Aspect

The display device according to the second or third aspect, in which the protruding portion is part of the edge cover layer.

Tenth Aspect

The display device according to any one of the first to ninth aspects, in which the light-emitting layer contains quantum dots.

Eleventh Aspect

The display device according to any one of the first to third aspects, in which the light-emitting layer contains quantum dots and is formed in the light-emitting region and the non-light-emitting region, and the protruding portion is formed by an edge of the light-emitting layer formed in the non-light-emitting region and a resin layer containing the quantum dots.

Twelfth Aspect

The display device according to any one of the first to eleventh aspects, in which the charge transfer layer contains fine particles.

Thirteenth Aspect

The display device according to any one of the first to twelfth aspects, in which the charge transfer layer is an inorganic film.

Fourteenth Aspect

The display device according to any one of the first to thirteenth aspects, a crack is formed in at least part of the thin film portion of the charge transfer layer.

Fifteenth Aspect

The display device according to a fourteenth aspect, in which a film thickness of the thin film portion of the charge transfer layer is larger than a width of the crack in a direction orthogonal to a film thickness of the charge transfer layer.

Sixteenth Aspect

The display device according to any one of the first to fifteenth aspects, in which the charge transfer layer is any one of an electron transport layer, a hole transport layer, an electron injection layer, a hole injection layer, an electron injection/transport layer, a hole injection/transport layer, an electron injection/transport and hole blocking layer, a hole injection/transport and electron blocking layer, an electron transport and hole blocking layer, and a hole transport and electron blocking layer.

Seventeenth Aspect

A method of manufacturing a display device including forming multiple first electrodes on a substrate, forming light-emitting layers including forming a first light-emitting layer on some of the multiple first electrodes, forming a second light-emitting layer on some other of the multiple first electrodes, and forming a third light-emitting layer on remains of the multiple first electrodes, providing a protruding portion in a region between the multiple first electrodes, after the providing a protruding portion, forming, on the protruding portion, a charge transfer layer including a thin film portion having a film thickness thinner than portions on the multiple first electrodes and a portion other than on the protruding portion in the region between the multiple first electrodes as a continuous film in a display region including the multiple first electrodes and the region between the multiple first electrodes on the substrate, and forming a second electrode.

Eighteenth Aspect

The method of manufacturing a display device according to a seventeenth aspect, further including forming an edge cover layer configured to cover an edge of each of the multiple first electrodes between the forming multiple first electrodes and the forming light-emitting layers, in which in the providing a protruding portion, the protruding portion is provided on the edge cover layer.

Nineteenth Aspect

The method of manufacturing a display device according to the seventeenth or eighteenth aspect, in which the forming a first light-emitting layer and providing the protruding portion with the first light-emitting layer are performed simultaneously, the forming a second light-emitting layer and providing the protruding portion with the second light-emitting layer are performed simultaneously, the forming a third light-emitting layer and providing the protruding portion with the third light-emitting layer are performed simultaneously, and each of the first light-emitting layer, the second light-emitting layer, and the third light-emitting layer is formed up to the region between the multiple first electrodes, and the protruding portion is provided in part of each of the first light-emitting layer, the second light-emitting layer, and the third light-emitting layer formed in the region between the multiple first electrodes.

Twentieth Aspect

The method of manufacturing a display device according to a nineteenth aspect, in which the protruding portion is provided at an edge of each of the first light-emitting layer, the second light-emitting layer, and the third light-emitting layer formed in the region between the multiple first electrodes.

Twenty-First Aspect

The method of manufacturing a display device according to the seventeenth or eighteenth aspect, in which the forming a first light-emitting layer and providing the protruding portion with the first light-emitting layer are performed simultaneously, the forming a second light-emitting layer and providing the protruding portion with the second light-emitting layer are performed simultaneously, the forming a third light-emitting layer and providing the protruding portion with the third light-emitting layer are performed simultaneously, and at least two of the protruding portion of the first light-emitting layer, the protruding portion of the second light-emitting layer, and the protruding portion of the third light-emitting layer are layered in the region between the multiple first electrodes.

Twenty-Second Aspect

The method of manufacturing a display device according to any one of seventeenth to twenty-first aspects, in which each of the first light-emitting layer, the second light-emitting layer, and the third light-emitting layer contains a photosensitive resin, and each of the first light-emitting layer, the second light-emitting layer, and the third light-emitting layer is patterned by exposure and development.

Twenty-Third Aspect

The method of manufacturing a display device according to any one of seventeenth, eighteenth, twentieth, and twenty-first aspects, in which each of the first light-emitting layer, the second light-emitting layer, and the third light-emitting layer is patterned by a lift-off method using a photosensitive resist.

Twenty-Fourth Aspect

The method of manufacturing a display device according to seventeenth or eighteenth aspect, in which the providing a protruding portion is performed before the forming light-emitting layers.

Twenty-Fifth Aspect

The method of manufacturing a display device according to any one of the seventeenth to twenty-fourth aspects, further including, after the providing a protruding portion, creating a crack in at least part of the charge transfer layer on the protruding portion.

Twenty-Sixth Aspect

The method of manufacturing a display device according to a twenty-fifth aspect, in which the creating a crack includes at least one of vacuum drying the charge transfer layer, heat treating the charge transfer layer, and deforming the substrate.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device and a method for manufacturing the display device.

The invention claimed is:

1. A display device comprising:
a substrate; and
on the substrate, a light-emitting element including a first electrode, a second electrode, and a light-emitting layer and a charge transfer layer between the first electrode and the second electrode,
wherein the display device includes a light-emitting region of the light-emitting element and a non-light-emitting region being a peripheral portion of the light-emitting region,
a protruding portion is provided in a layer lower than the charge transfer layer in part of the non-light-emitting region, and
the charge transfer layer is formed as a continuous film in a display region including the light-emitting region and the non-light-emitting region on the substrate, and includes a thin film portion, on the protruding portion, being thinner than a portion in the light-emitting region and a portion in the non-light-emitting region other than the protruding portion.

2. The display device according to claim 1, further comprising:
an edge cover layer configured to cover an edge of the first electrode,
wherein the protruding portion is provided on the edge cover layer.

3. The display device according to claim 2,
wherein an angle formed by an edge of the protruding portion and a lower face of the protruding portion is larger than an angle formed by a side surface of the edge cover layer forming an opening configured to expose part of the first electrode and a lower face of the edge cover layer provided on the first electrode.

4. The display device according to claim 1,
wherein the light-emitting layer is formed in the light-emitting region and the non-light-emitting region, and
the protruding portion is part of the light-emitting layer formed in the non-light-emitting region.

5. The display device according to claim 4,
wherein the light-emitting layer is formed in the light-emitting region and the non-light-emitting region, and
the protruding portion is an edge of the light-emitting layer formed in the non-light-emitting region.

6. The display device according to claim 1,
wherein multiple light-emitting elements are provided,
the multiple light-emitting elements include a first light-emitting element including a first light-emitting layer as the light-emitting layer, a second light-emitting element including a second light-emitting layer as the light-emitting layer, and a third light-emitting element including a third light-emitting layer as the light-emitting layer,
in a first direction of the substrate, the first light-emitting element, the second light-emitting element, and the third light-emitting element are arranged adjacent to each other,
the first light-emitting layer is formed in a light-emitting region of the first light-emitting element, part of a non-light-emitting region being a peripheral portion of the light-emitting region of the first light-emitting element, part of a non-light-emitting region being a peripheral portion of a light-emitting region of the second light-emitting element, and part of a non-light-emitting region being a peripheral portion of a light-emitting region of the third light-emitting element,
the second light-emitting layer is formed in the light-emitting region of the second light-emitting element, part of the non-light-emitting region being the peripheral portion of the light-emitting region of the first light-emitting element, part of the non-light-emitting region being the peripheral portion of the light-emitting region of the second light-emitting element, and part of the non-light-emitting region being the peripheral portion of the light-emitting region of the third light-emitting element, the third light-emitting layer is formed in the light-emitting region of the third light-emitting element, part of the non-light-emitting region being the peripheral portion of the light-emitting region of the first light-emitting element, part of the non-light-emitting region being the peripheral portion of the light-emitting region of the second light-emitting element, and part of the non-light-emitting region being the peripheral portion of the light-emitting region of the third light-emitting element, and the protruding portion provided in the non-light-emitting region is formed by layering at least two layers of the first light-emitting layer, the second light-emitting layer, and the third light-emitting layer.

7. The display device according to claim 3, wherein the protruding portion surrounds the light-emitting region.

8. The display device according to claim 1, wherein multiple light-emitting elements are provided, the multiple light-emitting elements include first light-emitting elements, each of the first light-emitting elements including a first light-emitting layer as the light-emitting layer, second light-emitting elements, each of the second light-emitting elements including a second light-emitting layer as the light-emitting layer, and third light-emitting elements, each of the third light-emitting elements including a third light-emitting layer as the light-emitting layer, in a first direction of the substrate, each of the first light-emitting elements, each of the second light-emitting elements, and each of the third light-emitting elements are arranged adjacent to each other, in a second direction of the substrate orthogonal to the first direction, the first light-emitting elements are arranged adjacent to each other, the second light-emitting elements are arranged adjacent to each other, and the third light-emitting elements are arranged adjacent to each other, the first light-emitting layer is formed in a light-emitting region of each of the first light-emitting elements and a non-light-emitting region being a peripheral portion of the light-emitting region of each of the first light-emitting elements, and is formed as one continuous film in a stripe shape in the second direction of the substrate, the second light-emitting layer is formed in a light-emitting region of each of the second light-emitting elements and a non-light-emitting region being a peripheral portion of the light-emitting region of each of the second light-emitting elements, and is formed as one continuous film in a stripe shape in the second direction of the substrate, the third light-emitting layer is formed in a light-emitting region of each of the third light-emitting elements and a non-light-emitting region being a peripheral portion of the light-emitting region of each of the third light-emitting elements, and is formed as one continuous film in a stripe shape in the second direction of the substrate, and the protruding portion provided in the non-light-emitting region along the second direction includes a portion in which one of an edge of the first light-emitting layer in the first direction, an edge of the second light-emitting layer in the first direction, and an edge of the third light-emitting layer in the first direction is layered with another of the edge of the first light-emitting layer in the first direction, the edge of the second light-emitting layer in the first direction, and the edge of the third light-emitting layer in the first direction.

9. The display device according to claim 2, wherein the protruding portion is part of the edge cover layer.

10. The display device according to claim 1, wherein the light-emitting layer contains quantum dots.

11. The display device according to claim 1, wherein the light-emitting layer contains quantum dots and is formed in the light-emitting region and the non-light-emitting region, and the protruding portion is formed by an edge of the light-emitting layer formed in the non-light-emitting region and a resin layer containing the quantum dots.

12. The display device according to claim 1, wherein the charge transfer layer contains fine particles.

13. The display device according to claim 1, wherein the charge transfer layer is an inorganic film.

14. The display device according to claim 1, wherein a crack is formed in at least part of the thin film portion of the charge transfer layer.

15. The display device according to claim 14, wherein a film thickness of the thin film portion of the charge transfer layer is larger than a width of the crack in a direction orthogonal to a film thickness of the charge transfer layer.

16. The display device according to claim 1, wherein the charge transfer layer is any one of an electron transport layer, a hole transport layer, an electron injection layer, a hole injection layer, an electron injection/transport layer, a hole injection/transport layer, an electron injection/transport and hole blocking layer, a hole injection/transport and electron blocking layer, an electron transport and hole blocking layer, and a hole transport and electron blocking layer.

17. A method of manufacturing a display device comprising:

forming multiple first electrodes on a substrate;

forming light-emitting layers including forming a first light-emitting layer on some of the multiple first electrodes, forming a second light-emitting layer on some other of the multiple first electrodes, and forming a third light-emitting layer on remains of the multiple first electrodes;

providing a protruding portion in a region between the multiple first electrodes;

after the providing a protruding portion, forming, on the protruding portion, a charge transfer layer including a thin film portion having a film thickness thinner than portions on the multiple first electrodes and a portion other than on the protruding portion in the region between the multiple first electrodes as a continuous film in a display region including the multiple first electrodes and the region between the multiple first electrodes on the substrate; and forming a second electrode.

18. The method of manufacturing a display device according to claim 17, further comprising:

forming an edge cover layer configured to cover an edge of each of the multiple first electrodes between the forming multiple first electrodes and the forming light-emitting layers, wherein in the providing a protruding portion, the protruding portion is provided on the edge cover layer.

19. The method of manufacturing a display device according to claim 17, wherein the forming a first light-emitting layer and providing the protruding portion with the first light-emitting layer are performed simultaneously, the forming a second light-emitting layer and providing the protruding portion with the second light-emitting layer are performed simultaneously, the forming a third light-emitting layer and providing the protruding portion with the third light-emitting layer are performed simultaneously, and each of the first light-emitting layer, the second light-emitting layer, and the third light-emitting layer is formed up to the region between the multiple first electrodes, and the protruding portion is provided in part of each of the first light-emitting layer, the second light-emitting layer, and the third light-emitting layer formed in the region between the multiple first electrodes.

20. The method of manufacturing a display device according to claim 17, wherein the forming a first light-emitting layer and providing the protruding portion with the first light-emitting layer are performed simultaneously, the forming a second light-emitting layer and providing the protruding portion with the second light-emitting layer are performed simultaneously, the forming a third light-emitting layer and providing the protruding portion with the third light-emitting layer are performed simultaneously, and at least two of the protruding portion of the first light-emitting layer, the protruding portion of the second light-emitting layer, and the protruding portion of the third light-emitting layer are layered in the region between the multiple first electrodes.

\* \* \* \* \*